United States Patent
Ito et al.

(10) Patent No.: US 7,781,244 B2
(45) Date of Patent: Aug. 24, 2010

(54) METHOD OF MANUFACTURING NITRIDE-COMPOSITE SEMICONDUCTOR LASER ELEMENT, WITH DISCLOCATION CONTROL

(75) Inventors: Shigetoshi Ito, Ikoma (JP); Takayuki Yuasa, Ikoma-Gun (JP); Yoshihiro Ueta, Yamatokoriyama (JP); Mototaka Taneya, Nara (JP); Zenpei Tani, Tondabayashi (JP); Kensaku Motoki, Minoo (JP)

(73) Assignees: Sharp Kabushiki Kaisha, Osaka-shi (JP); Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 12/211,577

(22) Filed: Sep. 16, 2008

(65) Prior Publication Data

US 2009/0011530 A1  Jan. 8, 2009

Related U.S. Application Data

(62) Division of application No. 10/493,137, filed as application No. PCT/JP02/11186 on Oct. 28, 2002, now Pat. No. 7,498,608.

(30) Foreign Application Priority Data

Oct. 29, 2001  (JP) ............................ 2001-330068
Oct. 29, 2001  (JP) ............................ 2001-330181

(51) Int. Cl.
*H01L 21/00* (2006.01)

(52) U.S. Cl. ............................. 438/32; 438/29; 438/31; 257/E33.067

(58) Field of Classification Search ............. 438/29–32; 257/E33.067

See application file for complete search history.

(56) References Cited

U.S. PATENT DOCUMENTS 6,855,959 B2 * 2/2005 Yamaguchi et al. ........... 257/98

FOREIGN PATENT DOCUMENTS

| EP | 0 852 416 | 7/1998 |
| JP | 56-059699 | 5/1981 |
| JP | 10-92749 | 4/1998 |

(Continued)

OTHER PUBLICATIONS

Shuji Nakamura et al., "InGaN/GaN/AlGaN-based laser diodes with modultion-doped strained-layer superlattices grown on an epitaxially laterally overgrown GaN substrate"., Nov. 7, 1997, pp. 211-213.

(Continued)

*Primary Examiner*—Thanh Nguyen
(74) *Attorney, Agent, or Firm*—Morrison & Foerster LLP

(57) ABSTRACT

A nitride semiconductor laser device with a reduction in internal crystal defects and an alleviation in stress, and a semiconductor optical apparatus comprising this nitride semiconductor laser device. First, a growth suppressing film against GaN crystal growth is formed on the surface of an n-type GaN substrate equipped with alternate stripes of dislocation concentrated regions showing a high density of crystal defects and low-dislocation regions so as to coat the dislocation concentrate regions. Next, the n-type GaN substrate coated with the growth suppressing film is overlaid with a nitride semiconductor layer by the epitaxial growth of GaN crystals. Further, the growth suppressing film is removed to adjust the lateral distance between a laser waveguide region and the closest dislocation concentrated region to 40 μm or more.

17 Claims, 15 Drawing Sheets

FOREIGN PATENT DOCUMENTS

| | | |
|---|---|---|
| JP | 11-224969 | 8/1999 |
| JP | 2000-183399 | 6/2000 |
| JP | 2001-039800 | 2/2001 |
| JP | 2001-94151 | 4/2001 |
| JP | 2001-102307 | 4/2001 |
| JP | 2001-148544 | 5/2001 |
| JP | 2001-196700 | 7/2001 |
| JP | 2001-274521 | 10/2001 |
| WO | WO 97/11518 | 3/1997 |
| WO | WO-03/034560 | 4/2003 |

OTHER PUBLICATIONS

Shin-ichi Nagahama et al., "High-Power and Long-Lifetime InGaN Multi-Quantum-Well Laser Diodes Grown on Low-Dislocation-Density GaN Substrates". May 15, 2000. pp. L 647-L 650.

Ito, S. et al. U.S. Office Action mailed on Jan. 12, 2007, directed to U.S. Appl. No. 10/493,137; 6 pages.

Ito, S. et al. U.S. Office Action mailed on Aug. 24, 2007, directed to U.S. Appl. No. 10/493,137; 7 pages.

International Search Report mailed on Feb. 12, 2003, directed to International Patent Application No. PCT/JP02/11186; 4 pages.

* cited by examiner

METHOD OF MANUFACTURING NITRIDE-COMPOSITE SEMICONDUCTOR LASER ELEMENT, WITH DISCLOCATION CONTROL

This application is a divisional of application Ser. No. 10/493,137 filed Oct. 18, 2004, which is the national stage filing of PCT/JP02/11186 filed on Oct. 28, 2002, which claims priority to Japanese Application No. 2001-330068 filed on Oct. 29, 2001, in its entirety.

BACKGROUND OF THE INVENTION

1. Technical Field

The present invention relates to a nitride-composite semiconductor laser element, which is constituted with plural nitride composite semiconductor layers laminated on a nitride-composite semiconductor substrate, and also relates to a method of manufacturing it, while the present invention further relates to a semiconductor optical device using the nitride-composite semiconductor laser element in subject.

2. Background Art

Conventionally, from the viewpoint of wave-band constitution and chemical stability, in the field of the III-V family nitride semiconductors consisting of the III family elements such as aluminum (Al), gallium (Ga), and indium (In), and of nitrogen (N) corresponding to one of the V family elements (this will merely be referred to as a GaN composite semiconductor hereinafter), there has been much expectation on the potential utility of this GaN composite semiconductor for its practical application to a light emitting element and a power device or the like. In order to realize the potential utility of this semiconductor, much effort has thus been pursued so as to manufacture a nitride composite semiconductor laser element capable of emitting blue laser beam, for example, by way of laminating the GaN composite semiconductor layers on a sapphire substrate (composed of $Al_2O_3$) or on a SiC composite substrate.

Nevertheless, when a thin film consisting of a crystalline GaN composite element has been formed on a sapphire substrate or on a SiC composite substrate, due to difference in the lattice constant between the GaN composite element and the substrate material, various defective phenomena such as "dislocation" for example are induced into an epitaxial layer. Because of this reason, in the case of a nitride composite semiconductor laser element enabling high-density current to flow through it, the above-cited defect triggers so as to cause the lattice constitution to become disordered, thereby further causing the above defective phenomena to potentially propagate themselves. Further, when the nitride-composite semiconductor laser element has been formed on a sapphire substrate, there is a problem in terms of its practical service life. It is conceived that, this is probably because occurrence of the high-density dislocation in the above element adversely acts, thereby restricting potential service life of the nitride-composite semiconductor laser element.

Due to the above reason, ideally, any substrate usable for loading the above GaN composite semiconductor device should preferably be composed of mono-crystalline GaN composite material. This constitution eliminates the difference of the lattice constant between the substrate and individual layers laminated on the substrate. Further, because the GaN composite compound itself contains compatibility with cleavages, a process for cutting a wafer into a plurality of chips can be facilitated. Further, since the GaN composite crystals are electrically conductive, processes for disposing electrodes in the above device can be simplified. Owing to these advantages, mono-crystalline GaN composite material is conceivably most suitable for constituting a substrate.

There is a report on the result of development in the field of a nitride composite semiconductor laser element capable of oscillating itself in a range from the ultra-violet region up to the visible rays region as shown in "Jpn. J. Appl. Phys. Vol. 39 (2000)", on pages L647 to 650. The nitride composite semiconductor in subject features a constitution in which a $SiO_2$ mask pattern with periodically striped openings was formed on a GaN composite substrate, and further, a structure consisting of laminated nitride semiconductor layers with a striped wave-guide passage (i.e., a ridge stripe structure) was formed on the above-cited mask pattern.

The above-cited GaN composite substrate was manufactured via execution of a process described below. By applying a MOCVD (Metalorganic Chemical Vapor-phase Deposition) method, a GaN composite layer with 15 μm of thickness was formed on the grounding seed crystals superficially being provided with a $SiO_2$ mask pattern containing striped openings per 20 μm of cyclic period before eventually generating a wafer with a flat surface. This method is conventionally defined as the ELOG (Epitaxially Lateral Overgrown) method, which, by way of availing lateral growth, causes defective phenomena to be decreased. Further, by applying a conventional HVPE (Hydride Vapor Phase Epitaxy) method, a GaN composite layer with 200 μm of thickness was formed, and then the grounding seed crystals were removed before eventually completing the processes for manufacturing a GaN composite substrate. In terms of the service life characteristics of the produced semiconductor laser element, it was so estimated that a maximum of 15000 consecutive service hours could be available under 30 mW of an output condition at 60° C. of environmental temperature.

Nevertheless, in the case of the above-cited nitride semiconductor laser element, since the method for manufacturing the GaN composite substrate necessitated growth of crystals by three cycles including the above-referred HVPE method, the MOCVD method for growing the grounding seed crystals, and the other MOCVD method for growing structure of semiconductor laser element, the method of manufacturing the above-cited nitride composite semiconductor laser element involves much complexity, thus generating a problem in terms of the productive efficiency. Further, the service life characteristics were evaluated to be still not sufficient. In particular, the service life characteristics were still insufficient under a high output condition (at 70° C. and 60 mW for example). In addition, it was found that crack could appear on the surface of the film grown after the growth of the laminate structure, thereby potentially causing the yield to be lowered during the production stage.

Generation of the above problems is caused by the crystalline defect, i.e., the "dislocation" generated in the above nitride composite semiconductor laser element. It was confirmed that, normally, the crystalline defect was generated on the surface of the GaN composite substrate by approximately $5 \times 10^7$ cm$^{-2}$. By applying any effective means for bending or extinguishing the crystalline defect, it is possible to generate such a region containing crystalline defect with a low density, thereby enabling to secure a sufficient service life under a high-output condition in which technical problems still remain without being solved. It is further suggested that, by providing a mechanism capable of structurally relaxing strain inside of crystal layers formed on the GaN composite substrate, it is possible to lower the probability of causing crack to be generated, thereby preventing the yield rate from being lowered otherwise caused by the crack generated on the surface of the grown film.

DISCLOSURE OF THE INVENTION

In the light of the above problems, the present invention aims at providing a nitride composite semiconductor laser element internally containing minimized crystalline defect and relaxed stress and also providing a semiconductor optical device incorporating such a nitride composite semiconductor laser element.

To achieve the above object, according to one aspect of the present invention, in a nitride semiconductor laser device provided with a nitride semiconductor substrate and a nitride semiconductor layer formed on top of the nitride semiconductor substrate, the nitride semiconductor substrate has, as a portion thereof, a stripe-shaped dislocation-concentrated region in which crystal defects concentrate and has, elsewhere, a low-dislocation region, a growth-inhibiting film for inhibiting growth of a nitride semiconductor crystal is formed on a surface of the nitride semiconductor substrate in a position where the growth-inhibiting film covers the dislocation-concentrated region, and the nitride semiconductor layer is formed by growing the nitride semiconductor crystal on top of the nitride semiconductor substrate in the position where the growth-inhibiting film is formed.

By virtue of the above arrangement, in the course of laminating the nitride composite semiconductor layers on the surface of the nitride composite semiconductor substrate, it is possible to inhibit dislocation of crystalline defect from those regions containing concentrated crystalline defect from further spreading itself, thus making it possible to prevent high-density crystalline defect portions from spreading themselves throughout the entire nitride composite semiconductor layers by proper effect of the growth inhibiting films. Accordingly, it is possible to lower the density of crystalline defect inside of the nitride composite semiconductor layers.

When constituting the above nitride composite semiconductor laser element, it is also practicable to provide each of those regions concentrated with crystalline defect with a plurality of growth inhibiting linear films so that these linear films can be disposed in the drain-board form, and further, it is also practicable to arrange that each of those regions concentrated with the dislocated crystalline defect can fully be covered with a plurality of growth inhibiting films. By virtue of this arrangement, those nitride composite semiconductor crystals grown from those discrete regions containing low-density dislocation can easily be combined with each other. Accordingly, unlike the case of laminating nitride composite semiconductor layers as of the condition in which nitride composite semiconductor crystals (grown from those regions each containing low-density crystalline defect) are not combined with a sheet-form growth inhibiting film even after formation of this sheet-form growth inhibiting film thereon, cleavage forming process can readily be executed.

When implementing the above process for forming a plurality of growth inhibiting linear films on each of the regions concentrated with the dislocated crystalline defect, it is so arranged that each of the linear films will be provided with a minimum of 1 μm and a maximum of 10 μm of width so as to be disposed in parallel with each other across a minimum of 1 μm and a maximum of 10 μm of intervals against individually adjoining growth inhibiting linear films, and further, it is so arranged that individual regions including a sum of the width and intervals of a plurality of these growth inhibiting films can fully cover those individual regions concentrated with the dislocated crystalline defect.

Further, it is so arranged that the nitride composite semiconductor substrate can be provided with n-type conductive characteristics, and yet, in order that all the growth inhibiting linear films can be covered, a GaN composite film containing the n-type conductive characteristics is formed on the surface of the nitride composite semiconductor substrate, thus completing formation of a GaN composite film with a plane surface. Owing to this arrangement, it is possible to prevent the high-density crystalline defect regions from propagating themselves throughout the entire nitride composite semiconductor layers. Further, by providing the nitride composite semiconductor substrate with the n-type conductivity having a high resistance value, it is possible to serially laminate each of the nitride composite semiconductor layers according to the sequence of the n-type followed by the p-type. This in turn contributes to an improvement of the superficial flatness of the nitride composite semiconductor layers formed with grown crystals, thereby enabling to decrease the threshold value of current required for the output of laser beam. In the course of forming the GaN composite film containing the n-type conductive characteristics, the film thickness is arranged to be a minimum of 1 μm and a maximum of 20 μm.

Further, by way of arranging the thickness of each of the growth inhibiting linear films to be a minimum of 0.05 μm and a maximum of 1 μm, it is possible to enable the growth inhibiting films to individually exert own proper effect and also prevent the growth inhibiting films from generating adverse influence. In the present invention, it is defined that the above-referred growth inhibiting film consists of a silicon compound film or a metallic film. In particular, in this case, the above referred growth inhibiting film shall consist of a thin film made from $SiO_2$, $Si_3N_4$, Ti (titanium), or W (tungsten).

In the course of manufacturing the above nitride composite semiconductor laser element, it may be so arranged that the nitride composite semiconductor layers further contain quantum well active layer having a composition expressed in terms of "$In_xGa_{1-x}N$ (0<x<1)". Further, it may be so arranged that at least any of those elements including As (arsenic), P (phosphor), and Sb (antimony), shall be contained in the active layer. In particular, it is preferred that the above nitride composite semiconductor substrate be composed of the GaN composite elements.

According to another aspect of the present invention, a method of fabricating a nitride semiconductor laser device including a nitride semiconductor substrate and a nitride semiconductor layer formed on top of the nitride semiconductor substrate includes the steps of forming, on a surface of the nitride semiconductor substrate, which has, as a portion thereof a stripe-shaped dislocation-concentrated region in which crystal defects concentrate and has, elsewhere, a low-dislocation region, a growth-inhibiting film for inhibiting growth of a nitride semiconductor crystal in a position where the growth-inhibiting film covers the dislocation-concentrated region; and then forming the nitride semiconductor layer by growing the nitride semiconductor crystal on top of the nitride semiconductor substrate in the position where the growth-inhibiting film is formed.

It is also practicable to initially form the growth inhibiting films all over the surface of the above nitride composite semiconductor substrate followed by execution of an etching process so as to cover only those regions concentrated with dislocated crystalline defect with the growth inhibiting films. Further, availing of the n-type electrical conductive characteristics of the nitride composite semiconductor substrate, it is also practicable to form a GaN composite film incorporating the n-type conductive characteristics on the nitride composite semiconductor substrate so as to fully conceal the growth inhibiting films after covering those regions concentrated with dislocated crystalline defect with the growth inhibiting films and then followed by execution of a process for causing the nitride composite semiconductor crystals to be grown on the surface of the formed GaN composite film before eventually laminating the nitride composite semiconductor layers thereon.

According to another aspect of the present invention, in a nitride semiconductor laser device provided with a nitride semiconductor substrate and a nitride semiconductor layer formed on top of the nitride semiconductor substrate, the nitride semiconductor substrate has, as a portion thereof a stripe-shaped dislocation-concentrated region and has, elsewhere, a low-dislocation region, the nitride semiconductor layer has a stripe-shaped laser light guide region, the laser light guide region is located above the low-dislocation region and substantially parallel to the dislocation-concentrated region, and a distance d in a horizontal direction between the laser light guide region and a dislocation-concentrated region closest thereto is 40 μm or more. Displacing the laser beam guide region from the regions concentrated with dislocated crystalline defect by more than 40 μm prevents adverse influence potentially caused by the dislocation of the substrate from affecting the laser beam guide regions, thereby making it possible to secure a durable semiconductor laser element capable of extending its service life in terms of the laser oscillating capability.

According to another aspect of the present invention, in a nitride semiconductor laser device provided with a nitride semiconductor substrate and a nitride semiconductor layer formed on top of the nitride semiconductor substrate, the nitride semiconductor substrate has, as portions thereof, a plurality of dislocation-concentrated regions in a shape of stripes substantially parallel to one another and has, elsewhere, low-dislocation regions, the nitride semiconductor layer has a stripe-shaped laser light guide region, the laser light guide region is located above the low-dislocation regions and substantially parallel to the dislocation-concentrated regions, a distance d in a horizontal direction between the laser light guide region and a dislocation-concentrated region closest thereto is 40 μm or more, and, assuming that a middle region of each low-dislocation region is located along a middle line between adjacent dislocation-concentrated regions, a distance t in the horizontal direction between the laser light guide region and a middle region, closest thereto, of a low-dislocation region is 30 μm or more. Presence of a plurality of regions concentrated with dislocated crystalline defect in a nitride semiconductor substrate may create, in a central portion of a region containing crystalline defect with a low density, a region having slightly different properties from the region surrounding it. By displacing the laser beam guide region by 30 μm or more from such a region containing crystalline defect with a low density, it is possible to obtain a semiconductor laser element with a long single-layer laser oscillation life.

According to another aspect of the present invention, in a nitride semiconductor laser device provided with a nitride semiconductor substrate and a nitride semiconductor layer formed on top of the nitride semiconductor substrate, the nitride semiconductor substrate has, as a portion thereof, a stripe-shaped dislocation-concentrated region and has, elsewhere, a low-dislocation region, the low-dislocation region have a high-luminescence region, the dislocation-concentrated region is substantially parallel to the high-luminescence region, the nitride semiconductor layer has a stripe-shaped laser light guide region, the laser light guide region is located above the low-dislocation region and substantially parallel to the dislocation-concentrated region, a distance d in a horizontal direction between the laser light guide region and a dislocation-concentrated region closest thereto is 40 μm or more, and a distance t in the horizontal direction between the laser light guide region and a high-luminescence region closest thereto is 30 μm or more. By way of displacing the laser beam guide region from one of the high luminescence regions having specific characteristics different from that of the peripheral regions, it is also possible to produce a semiconductor laser element incorporating an extensible service life.

Desirably, the distance "p" between adjoining regions each being concentrated with stripe-form dislocated crystalline defect present inside of the nitride composite semiconductor substrate shall be within a minimum of 140 μm. Provision of this distance "p" facilitates the process for displacing the laser beam guide region from those regions concentrated with dislocated crystalline defect during the production stage.

It is further desired that the distance "p" shall remain within a maximum of 1000 μm in order that any unwanted portion displaced from the bottom portion of the laser beam guide region among those discrete regions each accommodating low-density dislocation will not be able to further spread excessively.

It is possible to use such a nitride composite semiconductor substrate internally containing those regions concentrated with stripe-form dislocated crystalline defect being disposed substantially in parallel with the direction [1-100] of the substrate itself.

According to another aspect of the present invention, in a nitride semiconductor laser device provided with a nitride semiconductor substrate and a nitride semiconductor layer formed on top of the nitride semiconductor substrate, the nitride semiconductor substrate has a stripe-shaped high-luminescence region, the nitride semiconductor layer has a stripe-shaped laser light guide region, the laser light guide region is substantially parallel to the high-luminescence region, and a distance t between the laser light guide region and a high-luminescence region closest thereto is 30 μm or more. By way of displacing the laser beam guide region from one of the high luminescence regions having specific characteristic differing from that of the peripheral high luminescence regions, it is possible to produce a durable semiconductor laser element with an extensible service life.

It is possible to use such a nitride-composite semiconductor substrate incorporating a certain number of high luminescence regions in its [1-100] direction.

It is also possible to constitute the nitride-composite semiconductor layers incorporating quantum well active layer having a composition defined as "$In_xGa_{1-x}N$ (0<x<1)".

Further, it is also possible to constitute the nitride composite semiconductor incorporating quantum well active layer consisting of nitride composite semiconductor containing at least any of those elements including arsenic (As), phosphor (P), and antimony (Sb).

According to another aspect of the present invention, a method of fabricating a nitride semiconductor laser device including the step of forming, on a nitride semiconductor substrate having, as portions thereof a plurality of dislocation-concentrated regions in a shape of stripes substantially parallel to one another and has, elsewhere, low-dislocation regions, a nitride semiconductor layer including a nitride semiconductor laser structure having a stripe-shaped laser light guide region further includes the steps of forming the laser light guide region above a low-dislocation region; and leaving a distance d of 40 μm or more in a horizontal direction between the laser light guide region and a low-dislocation region closest thereto. When implementing this method, it is so arranged that the laser beam guide region is disposed above the discrete regions accommodating low-density dislocation substantially in parallel with those regions concentrated with dislocated crystalline defect, and further it is so arranged that the horizontal directional distance "d" between those laser beam guide regions and those regions concentrated with dislocated crystalline defect being closest to the laser beam guide region to be a minimum of 40 μm. The above arrangement prevents adverse influence potentially caused by the dislocation of the substrate from affecting the laser beam guide regions, thereby making it possible to secure a durable semiconductor laser element capable of extending its service life in terms of the laser oscillating capability.

When the center line portion of the adjoining striped regions concentrated with dislocated crystalline defect corresponds to the center line portion of those regions containing low-density arrangement, it is also possible to determine the horizontal directional distance "t" between the laser beam guide region and those regions containing low-density dislocation to be a minimum of 30 μm. By displacing the laser beam guide regions from the center portion of a region containing low-density dislocation, which may have specific characteristics slightly differing from that of the peripheral regions, it is also possible to secure a durable semiconductor laser element with an extensible service life.

It is suggested that, when using a nitride-composite semiconductor substrate containing a striped high-luminescence region substantially in parallel with those regions concentrated with stripe-form dislocated crystalline defect within those regions accommodating low-density dislocation, the horizontal directional distance "t" between the laser beam guide region and one of the high-luminescence regions being closest to this laser beam guide region may be arranged to be a minimum of 30 μm. By way of displacing the laser beam guide region from one of the high-luminescence regions containing specific characteristics slightly differing from that of the peripheral regions, it is possible to secure a semiconductor laser element with a further extensible service life.

It is recommended to use such a nitride composite semiconductor substrate internally containing those adjoining regions concentrated with dislocated crystalline defect across a minimum of 140 μm of the distance "p" between them. This arrangement facilitates displacement of the laser beam guide regions from those regions concentrated with stripe-form dislocated crystalline defect.

In addition, it is also recommended to use a nitride composite semiconductor substrate internally containing those adjoining regions concentrated with dislocated crystalline defect across a maximum of 1000 μm of the distance "p". This arrangement avoids generation of such a defective semiconductor laser element containing much unwanted portions not normally being present below the laser beam guide regions among those regions internally containing low-density dislocation, and yet, this arrangement further improves the yield rate.

According to another aspect of the present invention, a method of fabricating a nitride semiconductor laser device including the step of forming, on a nitride semiconductor substrate having a plurality of stripe-shaped high-luminescence regions substantially parallel to one another, a nitride semiconductor layer including a nitride semiconductor laser structure having a stripe-shaped laser light guide region further includes the steps of forming the laser light guide region substantially parallel to the high-luminescence regions; and leaving a distance t of 30 μm or more in a horizontal direction between the laser light guide region and a high-luminescence region closest thereto. This method also makes it possible to secure a durable semiconductor laser element with an extensible service life.

It is possible to use such a nitride composite semiconductor substrate containing those regions concentrated with dislocated crystalline defect, wherein the substrate has saw-teethed projections and recesses superficially provided with facets {11-22} and accommodates those regions concentrated with dislocated crystalline defect below the bottom of the superficial projections and recesses.

It is further possible to use such a nitride composite semiconductor substrate containing a certain number of high-luminescence regions, wherein the substrate has saw-teethed projections and recesses superficially provided with facets {11-22} and accommodates the high-luminescence regions beneath the vertex of the superficial projections and recesses.

The semiconductor optical device according to the present invention features that the above-described nitride composite semiconductor laser element constitutes a light source.

BEST MODE FOR CARRYING OUT THE INVENTION

Figure 1A:
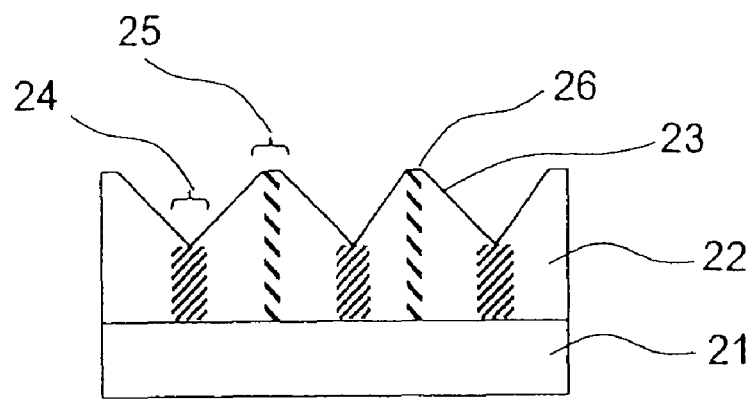
FIG. 1A to FIG. 1D are schematically explanatory of serial processes for manufacturing an n-type GaN composite semiconductor substrate.

Referring now to the accompanying drawings, practical forms for implementing the present invention are described below.

It should be understood that the nitride composite semiconductor substrate described in this specification at least consists of composite elements defined as "$Al_xGa_yIn_zN$ ($0 \leq x \leq 1$, $0 \leq y \leq 1$, $0 \leq z \leq 1$, $x+y+z=1$)". It should also be understood that approximately less than 20% of the nitrogen component for constituting the inventive nitrogen composite semiconductor substrate may be substituted with at least any of those elements including arsenic (As), phosphor (P), and antimony (Sb).

When constituting the nitride composite semiconductor substrate related to the present invention, most desirably, binary crystalline GaN composite element is used. Provision of binary crystalline GaN composite element stabilizes the elementary composition, thereby making it possible to readily secure stable characteristics suitable for a substrate. Further, in the case of growing epitaxial layers on the substrate, there is no fear of causing the epitaxial composition to incur variation. Further, provision of the GaN composite element generates satisfactory electrical conductivity. Next, the AlGaN composite substrate is described below. Inasmuch as the AlGaN composite substrate is constituted with composite elements having own index of refraction being less than that of the GaN composite element, when constituting a semiconductor laser component capable of emitting light ranging from UV region to blue region with the AlGaN composite element, it is possible to more effectively confine laser beam within its active layer.

The nitride composite semiconductor substrate may be added with impurities such as n-type or p-type dopant or the like. Available impurities include chlorine (Cl), oxygen (O), sulfur (S), selenium (Se), tellurium (Te), carbon (C), silicon (Si), germanium (Ge), zinc (Zn), cadmium (Cd), magnesium (Mg), and beryllium (Be). It is desired that a total amount of addable impurities shall be a minimum of "$5 \times 10^{16}$ $cm^{-3}$" and a maximum of "$5 \times 10^{20}$ $cm^{-3}$". In order to provide the nitride composite semiconductor substrate with the n-type electrical conductivity, among those impurities cited above, any of those elements including Si, Ge, O, Se, and Cl, is particularly suitable for use.

The constitution of the nitride composite semiconductor layers laminated on the nitride composite semiconductor substrate is practically defined as "$Al_xGa_yIn_zN$ ($0 \leq x \leq 1$, $0 \leq y \leq 1$, $0 \leq z \leq 1$, $x+y+z=1$)". A certain amount corresponding to approximately less than 10% of the nitrogen constituent for composing the nitride composite semiconductor layers may be substituted with at least any of those elements including As, P, and Sb on condition, as far as the semiconductor layers belong to hexagonal crystal system.

Further, the nitride composite semiconductor layers may also be added with at least any of the above-cited impurities including Si, O, Cl, S, C, Ge, Zn, Cd, Mg, and Be. It is desired that a total amount of addable impurities shall be a minimum of $5 \times 10^{16}$ $cm^{-3}$ and a maximum of $5 \times 10^{20}$ $cm^{-3}$. In order to provide the nitride composite semiconductor layers with the n-type electrical conductivity, among the above-cited addable impurities, any of those elements including Si, Ge, S, Se, and Te, is particularly suitable for use. For the sake of providing the p-type electrical conductivity, any of those elements including Mg, Cd, and Be, is particularly suitable for functioning as impurities addable to the above layers.

It is defined that the term "active layer" implies the general terms of a well layer or a composite well consisting of a well layer and a barrier layer. For example, an individual active layer consisting of a mono-quantum well structure is composed of a single well layer or a composite structure consisting of a combination of a barrier layer, a well layer, with another barrier layer. Another active layer based on a multiple quantum well structure consists of a plurality of well layers and a plurality of barrier layers.

The GaN composite element is hexagonal, and thus, in order to represent axial direction and surface direction, a specific notation using four indices is introduced. Axis "a" and axis "b" jointly form 120 degrees and have an equal length (a=b), whereas axis "c" being orthogonal to these axes "a" and "b" is a unique one without being equal to the axis "a" (c≠a). When the axes "a" and "b" are solely present, symmetry cannot be represented along the direction of the "a"/"b" surface, and thus, an additional axis is assumed to be axis "d". It should be understood that, although directional designation can duly be effected by the axes "a" and "b", in order that symmetry will not be lost, an additional axis "d" is introduced. Due to this reason, the axes "a", "b", and "d", are not independent of each other.

When it is assumed that a group of parallel surfaces is represented by four indices (k, l, m, and n), this in turn means that the distance from the origin to the points at which the first surface counted from the origin cuts the axes "a", "b", "d", and "c" corresponds to a/k, b/l, d/m, and c/n. This definition is identical to the case of other crystal systems. It should be understood however that, since the axes a, b, and d, constitute a redundant coordinate, those indices k, l, and m, are not independent of each other, but instead, k+l+m=0 is stationary at any time.

Definition in the case of dealing with the axis "c" is identical to that is applicable to cubic system. Assume that n-units of surfaces in parallel with each other are present along the unit length of the axis "c", an index in the direction of the direction "c" becomes "n". Due to the above reason, among four indices, each of the former three indices has own rotation symmetry except for the index of the axis "c" because the index of the axis "c" is independent of the others.

Individual surface direction is represented by ( . . . ), whereas collective surface direction is expressed by { . . . }. The term "collective" means assembly of all the surface directions that can be reached by way of performing all the symmetrical operations for enabling a certain crystal system to accept a specific surface direction. Crystalline direction is also represented by these indices. When expressing the crystalline direction, an index corresponding to that of a surface perpendicular to the crystalline direction is used. Individual direction is represented by [ . . . ], whereas collective direction is represented by < . . . >. Although the above notations are commonly known in the crystallography, in order to enable the concerned to better understand the description, the above meaning has been explained. According to the rule of the crystallography, any negative index is denoted by way of drawing a horizontal line right above the corresponding numeral so as to enable a viewer to instinctively identify the negative index. However, it is not practicable to draw a horizontal line right above the corresponding numeral in the present description, and thus, a sign "−" is shown just before the corresponding numeral so that a negative number can be identified.

[Method of Manufacturing a GaN Composite Substrate]

First, referring to FIG. 1A to FIG. 1D, a method of manufacturing a GaN composite substrate superficially being formed with nitride composite semiconductor layers required for eventually producing a nitride composite semiconductor laser element is described below. It should be understood that FIG. 1A to FIG. 1D respectively designate serial processes to be executed for manufacturing an n-type GaN composite semiconductor substrate.

In the production of the n-type GaN composite substrate, slanted portions called "facets" are generated in the surface of growing crystal. The term "facet" refers to a surface other than the surface (growth surface) perpendicular to the growth direction. By following up growth while maintaining the facet generation, it is possible to cause the "dislocation" to spread itself in the growing direction before being assembled into a predetermined position. The region accommodating the facets becomes the above-referred "region accommodating low-density dislocation" due to migration of the crystalline defect, i.e., the "dislocation". In addition, beneath the facets appear those regions containing high-density crystalline defect each being located across a definite interface. Since the "dislocation" assembles at the interface or inside of the regions containing high-density crystalline defect (corresponding to the region concentrated with the "dislocated" crystalline defect to be described later on), the dislocated crystalline defect disappears or builds up in the region containing high-density crystalline defect.

When the above condition is present, depending on the shape of those regions accommodating high-density crystalline defect, shape of the facet varies. Concretely, when those regions containing high-density crystalline defect are dotted with each other, the facet is formed so as to surround those regions containing high-density crystalline defect, thereby generating pits consisting of the facet. On the other hand, when those regions containing high-density crystalline defect are formed in the form of stripe pattern, facets are formed on both sides of each of those regions containing high-density crystalline defect so as to place the striped portion of the region containing high-density crystalline defect to become the bottom of a groove having a V-shaped cross-section.

In order to form those regions containing high-density crystalline defect, it is essentially required to previously form seeds consisting of amorphous or polycrystalline layers required for generating the "dislocation" at predetermined portions for forming those regions containing high-density crystalline defect on a supporting substrate available for the grounding substrate. By causing GaN composite material to be grown on the supporting substrate superficially forming the seeds for generating the "dislocation", those regions each containing high-density crystalline defect are formed in those portions right above the dislocation-forming seeds. Further, by way of causing the GaN composite layers to be grown in those regions each containing high-density crystalline defect, it is possible to proceed with a process for growing the GaN composite material while maintaining the facets without necessarily burying it.

Concretely, when causing the n-type GaN layer 22 to be grown on the supporting substrate 21 by applying the hydride vapor-phase epitaxial process (HVPE), it is so arranged that the facet {11-22} 23 can mainly be exposed to the under-growth surface. In consequence, as shown in FIG. 1A, cross-section of the surface portion becomes saw-teethed projections and recesses except for a local portion close to the vertex of each of the projections corresponding to the {0001} surface 26 slightly being exposed as a stripe.

When implementing the above-referred HVPE process, initially, a Ga boat is set to the upstream side of a hot-wall type reaction furnace so as to blow HCl gas against melted Ga liquid, and a substrate 21 is disposed to the downstream side of the hot-wall type reaction furnace so as to cause the GaN layer 22 to be grown via a blow of $NH_3$ gas against it. Next, the HCl gas is injected into the melted Ga so as to synthesize GaCl composite element. The synthesized GaCl composite element is brought downwards, and then subject to a reaction with the $NH_3$ gas so as to synthesize the GaN composite element, which is eventually deposited on the substrate 21.

When implementing the HVPE process, a wafer consisting of GaAS composite element with 2 inches of diameter and having a surface (111) was used as the substrate 21. The above-referred projections and recesses are respectively provided with 400 μm of periodical pitches and extended in the depth direction as seen in FIG. 1A. The GaAs wafer can easily be removed after completing production of an ingot of an n-type GaN layer 22 (to be described later on) subsequent to the growth of the GaN composite element, and thus, the GaAs wafer is more suitable for constituting the substrate 21 than the case of applying a sapphire wafer. In order to regulate positions of the above projections and recesses, it is recommended that, initially, $SiO_2$ masks each having a certain number of openings corresponding to the recesses be formed in advance, and then crystalline growth be carried on as of the state in which the facets remain exposed. Note that the above openings correspond to the above-referred seeds required for forming the "dislocation".

More specifically, the openings of the $SiO_2$ masks are respectively disposed in the stripe form across 400 μm of pitch so as to become in parallel with the direction [1-100] of the GaN composite crystals. It is possible to arrange the form of the $SiO_2$ masks to be of continuous stripes or aligned in rows in the individually dotted formation. The following description refers to a practical example in the production of the GaN composite substrate by way of forming the striped $SiO_2$ masks across 400 μm of intervals. However, the intervals between individual openings may not necessarily be 400 μm. Desirably, the intervals between them shall be a minimum of 100 μm, preferably, the intervals shall be a minimum of 200 μm and a maximum of 600 μm.

A method (a condition) for growing crystals as of the state of holding the facet {11-22} 23 externally being exposed was disclosed via the Japanese Laid-Open Patent Publication No. 2001-102307 under a previous patent application filed by the inventor of the present invention. By doping oxygen on the way of growing crystals, polarity of the crystals under growth becomes the n-type.

Figure 1B:
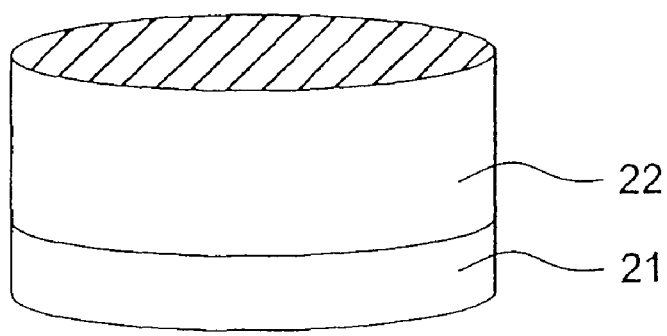
Figure 1C:
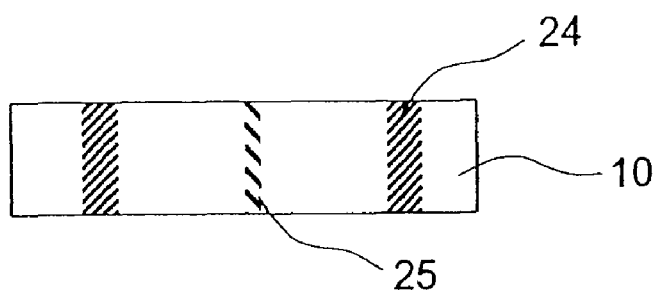
Figure 1D:
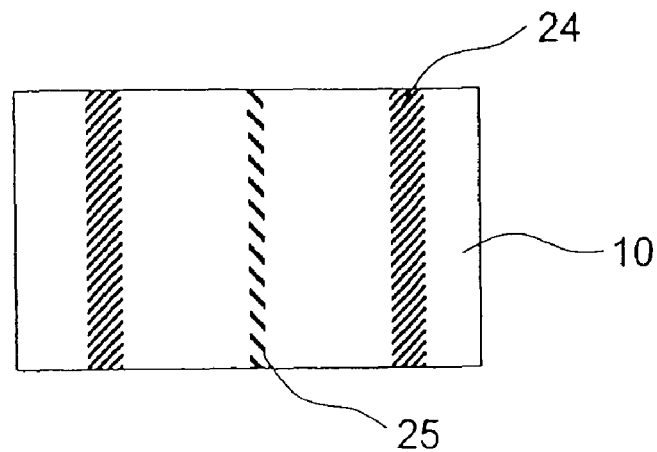

As described above, by way of sustaining growth of crystals as of the state in which the facets remain being exposed so as to further sustain formation of GaN composite crystals, as shown in FIG. 1B, an ingot consisting of the n-type GaN composite layers with 30 mm of height is eventually produced on the substrate 21. Simultaneously, facets corresponding to the masks for the seeds are also formed on the ingot surface. Concretely, when the masks are in the form of dotted patterns, all the pits consisting of the facets are regularly formed. On the other hand, when the masks are in the form of stripe-like patterns, V-shaped facets are formed.

Next, the ingot consisting of the n-type GaN composite layers 22 is sliced into a plurality of thin pieces via a slicing tool so as to secure the n-type GaN composite substrates. The sliced thin pieces are then subject to a grinding process before eventually completing production of the n-type GaN composite substrates 10 each having a flat surface, 2 inches of diameter, and 350 μm of the thickness as per a cross-sectional view shown in FIG. 1C and a plan view shown in FIG. 1D. Next, by further grinding the surfaces of the produced n-type GaN composite substrates 10, the surfaces of the produced substrates are fully leveled off to be ready for practical use. That is, in order to effect epitaxial growth on the n-type GaN composite substrates 10, all the surfaces are finished with a mirror polishing process.

The polished surface substantially satisfies the (0001) standard. However, in order to secure flat and satisfactory morphology of the nitride composite semiconductor layers superficially formed with the epitaxial growth, it is desired that a certain "off" angle be provided within a scope of 0.2 to 1° in the optional direction from the surface (0001), in particular, in order to minimize the superficial levelness, it is desired that the "off" angle be provided within a scope of 0.4 to 0.8°.

As a result of the microscopic observation against the polished surface of the produced n-type GaN composite substrates 10, it was detected that the polished surfaces were not fully leveled off, but fine projections and recesses were generated. Concretely, there were locally hollow portions corresponding to those regions 24 that became the bottom of the recesses during the process for growing crystals shown in FIG. 1A.

Further, samples of the produced n-type GaN composite substrates 10 were subjected to etching by immersing them in a blend solution containing sulfuric acid and phosphoric acid heated at 250° C. so that the etched pits assembled with facets could be exposed externally. As a result, a large number of etched pits emerged in the area corresponding to the bottom regions 24, and thus it was found that the "dislocation" phenomenon had extremely concentrated into the above area. It is conceived that, since the "dislocation" phenomenon had extremely concentrated into the area 24, this area was more vulnerable to erosion during the polishing process, thereby resulted in the generation of the locally hollow portions.

It was detected that the hollow generated local portion had approximately 10 to 40 μm of the width. Those portions other than the above portion 24 were shared by such regions that contained low-density dislocation corresponding to $10^4$ to $10^5$ cm$^{-2}$ of the etched pit density (EPD). The above portion 24 had contained the etched pit density by more than three figures against other portions. These hollow portions 24 individually correspond to the above-referred regions containing high-density crystalline defects in those portions each having substantial density of crystalline defect (the density of the "dislocation") by substantial figures greater than those which are present in the peripheral portions, and thus, these portions will be referred to as the "regions concentrated with the dislocation" hereinafter in this specification.

It was detected that, unlike other regions on the n-type GaN composite substrate, there was the inversion of the polarity in the region 24 concentrated with the dislocation. More particularly, although those regions other than the dislocation concentrated region 24 correspond to the surface direction in which only the gallium (Ga) constituent is externally exposed on the surface of the n-type GaN substrate 10, there was a case in which nitrogen (N) constituent was externally exposed in those regions 24 concentrated with the dislocation. Including the inversion of the polarity cited above, there are some aspects in the dislocation concentrated region 24. For example, there is such a case in which the dislocation concentrated region 24 consists of polycrystalline structure. Further, there is such a case in which, despite of its mono-crystalline structure, the region 24 slightly inclines against peripheral regions containing crystalline defect with a low density. Further, there is such a case in which the axis "c" in the direction of [0001] is inverted against peripheral regions containing crystalline defect with a low density. It should be noted that each of those regions concentrated with the dislocation has a definite interface so as to distinguish each of them from any of the peripheral regions.

Next, samples of the n-type GaN composite substrate 10 were irradiated with ultra-violet rays (it is possible to use 365 nm bright line via a mercury (Hg) lamp), and then, luminescence from the sample surface was observed via a fluorescent microscope. As a result, it was observed that there were stripe-form regions having relatively clear interfaces at the center of those regions containing low-density dislocation sandwiched by those regions 24 concentrated with dislocation with different contrast effect from that of the peripheral regions. Those stripe-form regions respectively emit intense luminescence, which is more visible with slightly yellowish luminosity than in the case of the peripheral regions.

The observed region 25 emitting bright luminosity corresponds to the portion at which the surface {0001} followed growth as of the exposed state on the way of growing crystals. The observed region 25 showed a difference from other portions in the observed effect. This is conceivably because there was a difference in the aspect of the induced dopant from that was generated in the peripheral regions. Based on the above reason, this particular region 25 will be referred to as the "high-luminescence region" in the following description. Since the above-referred portion at which the surface {0001} followed growth as of the exposed state on the way of growing crystals did not proceed with the crystalline growth as of a constant width uniformly, although slightly being variable, it was evaluated that the width of the high-luminescence region 25 was in a range from 0 μm to a maximum of 30 μm.

In order to implement a process for growing crystals required for the formation of the above-referred n-type GaN composite substrate 10, any of the following methods other than the HVPE method may be applied, which include; a vapor phase growing method, the "Metalorganic chemical vapor phase deposition (MOCVD)" method, the "Metalorganic chloride vapor phase epitaxy (MOVPE)" method, and a sublimation method.

In order to constitute the above-referred substrate 21 required for the growth of crystals for the formation of the n-type GaN composite substrate 10, not only the GaAs composite material, but it is also possible to use a mono-crystalline substrate capable of generating symmetry in the periphery of axes for three rounds or six rounds, in other words, it is possible to use hexagonal mono-crystals or cubic symmetrical mono-crystals. By applying the (111) surface, the cubic symmetrical mono-crystals can generate symmetry for three rounds. Any of those hexagonal mono-crystals including sapphire, SiC, $SiO_2$, $NdGaO_3$, ZnO, GaN, AlN, $ZrB_2$ may be used. Further, it is also possible to use a substrate consisting of the cubic symmetrical (111) surface composed of Si, spinnel, MgO, or GaP. These composite elements enable GaN composite material to be grown with the (0001) surface being the growing surface.

There are two methods for forming masks required for the formation of the n-type GaN composite substrate 10. One of these two method enables masks to be formed on the substrate 21 directly. In this case, it is required to arrange any effective means by way of depositing GaN composite buffering layers on the exposed surface of the substrate inside of window prior to the formation of the epitaxial layers. The other method previously forms thin GaN composite layers on the substrate and then forms masks on the GaN composite layers. In many cases, the latter method enables crystals to be grown very smoothly, and thus, the latter method is preferred.

FIRST EMBODIMENT OF THE PRESENT INVENTION

Figure 2:
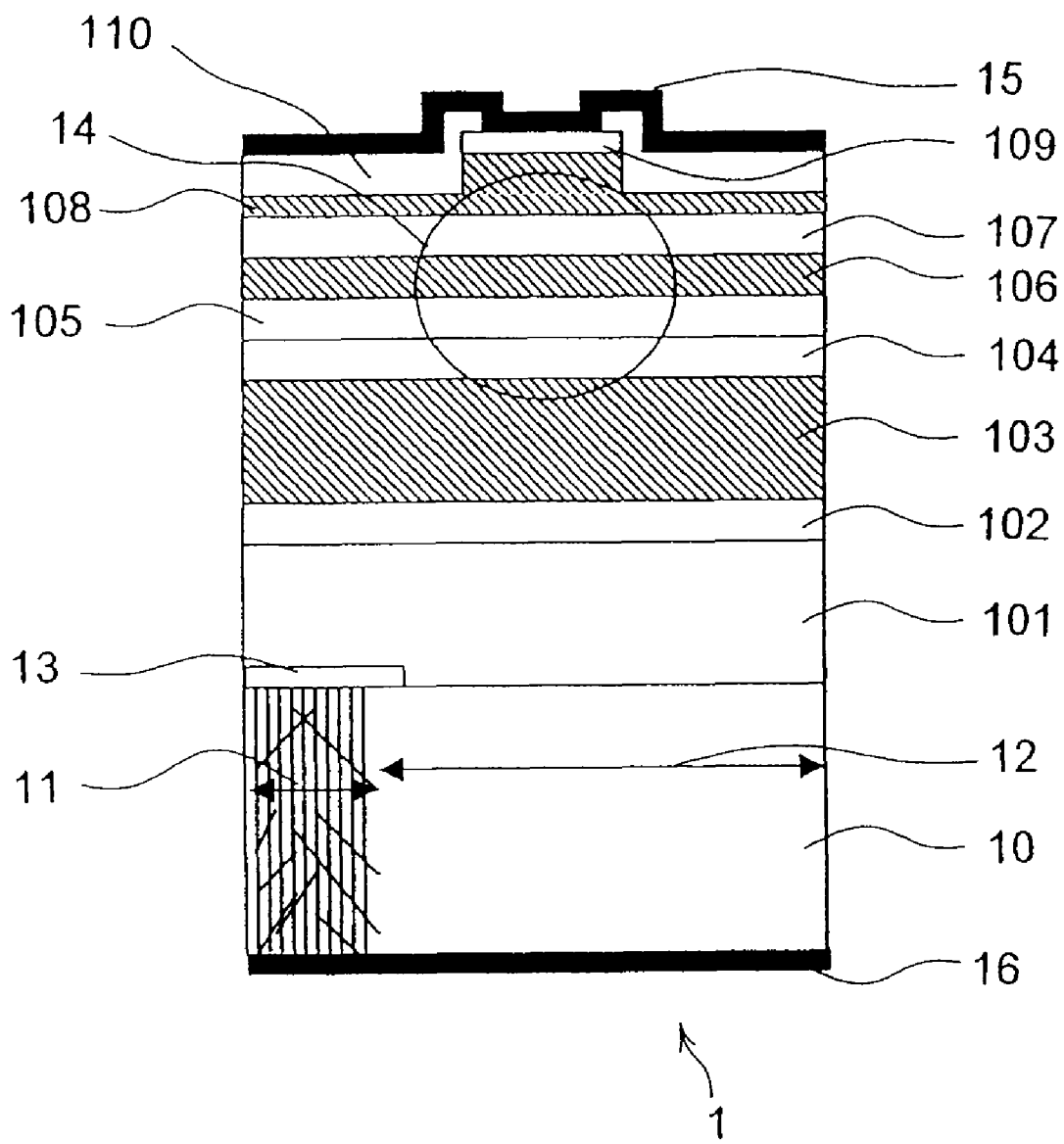
FIG. 2 is a cross-sectional view of the internal constitution of a nitride-composite semiconductor laser element according to a first embodiment of the present invention.

Referring now to the accompanying drawings, the first embodiment of the present invention for manufacturing a nitride composite semiconductor laser element is described below, wherein the nitride composite semiconductor laser element is produced by applying an n-type GaN composite substrate incorporating the above-referred regions concentrated with the "dislocated" crystalline defect and the above-referred "high-luminescence regions". FIG. 2 is a cross-sectional view exemplifying the constitution of the nitride-composite semiconductor laser element 1 according to the first embodiment of the present invention. Note that illustration of the "high-luminescence region" is not shown in FIG. 2.

[Process for Forming "Growth Inhibiting Films"]

First, a growth inhibiting film 13 shown in FIG. 2 is formed on the surface of the n-type GaN composite semiconductor substrate 10. The growth inhibiting film 13 is formed so as to cover a "dislocation concentrated region" 11 (corresponding to the dislocation concentrated region 24 shown in FIG. 1A to FIG. 1D) on the surface of the n-type GaN composite substrate 10. When constituting the nitride composite semiconductor laser element of the present invention by laminating the nitride composite semiconductor layers on the n-type GaN composite substrate 10, the growth inhibiting film 13 prevents the dislocation from being succeeded within the film grown on the n-type GaN composite substrate 10. Due to this reason, the growth inhibiting film 13 should be composed of a specific material that totally disables epitaxial growth of normal nitride composite semiconductor from the growth inhibiting film 13. To achieve this, the first embodiment of the present invention has introduced silicon dioxide $SiO_2$ for constituting the growth inhibiting film 13.

First, the n-type GaN composite substrate 10 is placed inside of an electronic-beam-applied vapor deposition device. When the inner pressure has reached a predetermined vacuum degree, by controlling the thickness of silicon dioxide so as to become 0.2 μm, a $SiO_2$ film is formed on the surface of the n-type GaN substrate 10. Next, availing of a simple lithographic etching method, the $SiO_2$ film complete with a vapor-phase deposition process is treated with an etching process so as to solely conceal the dislocation concentrated region 11 on the surface of the n-type GaN composite substrate 10, thus forming the growth inhibiting film 13. Since the dislocation concentrated region 11 has a maximum of 40 μm of the width, it is so arranged that the growth inhibiting film 13 for covering the region 11 is provided with 50 μm of own width. By implementing the above arrangement, the GaN composite crystals are grown from a region 12 containing low-density dislocation.

The first embodiment has duly introduced silicon dioxide for composing the growth inhibiting film 13. However, it is also allowable to introduce similar silicon compound such as $Si_3N_4$ for example, or metallic element such as tungsten (W), or titanium (Ti) as well. In this embodiment, the thickness of the growth inhibiting film 13 is defined as 0.2 μm. However, the growth inhibiting effect can be secured sufficiently by merely providing the film 13 with 0.05 μm up to 1.0 μm of the thickness. Further, in this embodiment, width of the growth inhibiting film 13 is defined as 50 μm. However, as far as the growth inhibiting film 13 has a width enough for covering the dislocation concentrated region 11 and for allowing further progress of epitaxial growth of a normal nitride composite semiconductor in the low-density dislocation region 12, the growth inhibiting film 13 may be provided with a wider width.

[Epitaxial Growth of the Nitride Composite Semiconductor Layers]

Using an MOCVD processing device, n-type GaN composite layer 101 having 3 μm of film thickness is formed at 800° C. of substrate temperature on an n-type GaN composite substrate 10 by applying $NH_3$ as the V-family source, TMGa (trimethyl-gallium) or TEGa (triethyl-gallium) as the III family source, and $SiH_4$ as dopant in presence of carrier gas comprising hydrogen or nitrogen. Next, a crack-preventing layer 102 composed of n-type of $In_{0.07}Ga_{0.93}N$ is formed by 40 nm by adding TMIn (trimethyl-indium) as the III family source to the above-referred composite material at 800° C. of the substrate temperature.

Next, by heating the substrate up to 1050° C., using TMAl (trimethyl-aluminum) or TEAl (triethyl aluminum) as the III family source, a clad layer 103 compound of n-type $Al_{0.1}Ga_{0.9}N$ having 1.2 μm of film thickness is formed. The dopant material was adjusted so that silicon as the n-type impurities could correspond to $5\times10^{17}$ cm$^{-3}$ to $1\times10^{19}$ cm$^{-3}$ in its composition. Next, n-type GaN light guide layer 104 having 0.1 μm of film thickness is formed, in which density of the silicon impurities is defined to be $1\times10^{16}$ to $1\times10^{18}$ cm$^{-3}$.

Then, the substrate temperature is lowered to 750° C., and an active layer consisting of the multiple quantum well structure 105 is formed. This layer 105 includes a barrier layer, a well layer, a barrier layer, a well layer, a barrier layer, a well layer, and a barrier layer, and thus has tertiary periodicity. The well layers are each $In_{0.1}Ga_{0.9}N$ with 4 nm of film thickness, and the barrier layers are each $In_{0.01}Ga_{0.99}N$ with 8 nm of film thickness. In the course of forming only the barrier layer or both the barrier layer and the well layer, $SiH_4$ is introduced, where the density of the silicon impurities is $1\times10^{16}$ to $1\times10^{18}$ cm$^{-3}$. At the time of switching the formation of the barrier layer and the well layer, if the growth process were suspended for a minimum of one second up to a maximum of 180 seconds, levelness of individual layers is promoted, and conversely, width of half-value luminous layer decreases favorably.

Arsenic material addable to the above active layer 105 includes the following: $AsH_3$ (arsine), or TBAs (tertiary butyl arsine), or TMAs (trimethyl arsine). Phosphoric material addable to the active layer 105 includes the following: $PH_3$ (phosphines), or TBP (tertiary butyl phosphine), or TMP (trimethyl phosphine). Antimony material addable to the active layer 105 includes TMSb (trimethyl antimony), or TESb (triethylene antimony). In the course of forming the active layer 105, as practically available nitrogen material, not only $NH_3$, but it is also allowable to use hydrazines such as $N_2H_4$ (hydrazine) and $C_2N_2H_8$ (dimethyl hydrazine), or azides such as ethyl azide.

When the active layer 105 incorporates plural layers of quantum wells comprising $In_xGa_{1-x}N$, and also when adding arsenic or phosphor to the active layers 105 to make it composed of active quantum layers, it is known that, if dislocation running through the quantum wells is present, indium segregates to the portion in which dislocation is present. Accordingly, when applying quantum wells mainly comprising the above-mentioned $In_xGa_{1-x}N$ to the active layers 105, in order to secure better laser effect, it is essential that occurrence of the dislocation (crystalline defect) be minimized as far as possible.

Next, the substrate is again heated up to 1050° C., and then are serially formed a p-type $Al_{0.3}Ga_{0.7}N$ carrier block layer 106 with 20 nm of film thickness, a p-type GaN light guide layer 107 with 0.1 μm of thickness, a p-type $Al_{0.1}Ga_{0.9}N$ clad layer 108 with 0.5 μm of thickness, and a p-type GaN contact layer 109 with 0.1 μm of thickness. In this process, as the p-type impurities, $EtCP_2Mg$ (bis-ethyl cyclopentadienyl magnesium) is used, and the concentration of magnesium is adjusted to be $1 \times 10^{18}$ cm$^{-3}$ to $2 \times 10^{20}$ cm$^{-3}$. As the magnesium material, it is allowable to use other cyclopenta dienyl compounds such as cyclopentadienyl magnesium and bismethyl cyclopentadienyl magnesium.

In terms of the concentration of p-type impurities in the p-type GaN composite contact layer 109, it is preferred that the concentration of p-type impurities be strengthened in the direction of the positive electrode 15. This arrangement will cause contact resistance to attenuate itself when forming the positive electrode 15. Further, in order to eliminate residual hydrogen within the p-type layer obstructing magnesium as the p-type impurities from being activated, a negligible amount of oxygen may be infused in the course of growing the p-type layer.

After completing formation of the p-type GaN composite contact layer 109, atmosphere inside of the reactor of the MOCVD device is thoroughly replaced with nitrogen carrier gas and $NH_3$, and then the temperature of the substrate is lowered at a rate of 60° C. per minute. When the temperature of the substrate reaches 800° C., supply of $NH_3$ is discontinued. Then, the substrate temperature is held on at 800° C. for 5 minutes before eventually lowering the substrate temperature to room temperature. It is preferred that the intermediate substrate temperature be held on in a range from 650° C. up to 900° C. for a minimum of 3 minutes and a maximum of 10 minutes. It is also preferred that the substrate temperature be lowered to room temperature at a rate of 30° C. per minute or higher.

Then, the nitride composite semiconductor layers complete with the above processes is subject to evaluation via Raman measuring method. Even though the wafers extracted from the above MOCVD processing device has not been treated with an annealing process for conversion into the positive type, since magnesium component has already been activated, immediately after the growth, the produced layers demonstrate specific characteristics proper to the positive type. Further, contact resistance caused by formation of the positive electrode 15 is lowered. In particular, by way of combining with a conventional annealing process for conversion into the positive type, efficiency in the activation of magnesium is favorably promoted.

In the n-type crack-prevention layer 102, which is $In_{0.07}Ga_{0.93}N$ in the above example, indium composite ratio may not be 0.07. Further, it is also permissible to omit the n-type InGaN crack-prevention layer 102 itself. However, if incompatibility of the lattice constitution between the n-type AlGaN clad layer 103 and the n-type GaN substrate 10 grows, for the sake of preventing crack from occurrence, it is preferred that the n-type InGaN crack prevention layer 102 be inserted. Alternatively, for the sake of preventing crack from occurrence, Ge (germanium) may be used in place of silicon as the n-type impurities.

Composite constitution of the above-referred active layer 105 is commenced with a barrier layer and completed with a barrier layer. Alternatively, composition of the active layer 105 may also be commenced with a well layer and completed with a well layer. The number of the well layer is not solely limited to three. When the number of the well layers is ten or less, current density at a threshold value remains low, thereby making it possible to generate oscillation continuously at room temperature. In this case, when a minimum 2 of well layers up to a maximum of 6 layers are provided, current density at a threshold value stably remains low, and thus, this constitution is particularly suitable for practical use. Further, it is also allowable to have the above active layer 105 contain aluminum.

Though the above description has solely referred to a constitution of the active layer 105 consisting of the well layers and the barrier layers respectively added with a specific amount of silicon as impurities, addition of the impurities to those layers may be omitted. However, luminous intensity is promoted when impurities are added to the active layer 105. Aside from silicon, any of those elements including oxygen, carbon, germanium, zinc, and magnesium, may be used for constituting impurities. It is preferred that a sum of addable impurities be arranged at approximately $1 \times 10^{17}$ to $8 \times 10^{18}$ cm$^{-3}$. Further, it is also allowable to add impurities to either of the well layers and the barrier layers instead of both layers.

Constitution of the p-type $Al_{0.3}Ga_{0.7}N$ carrier block layer 106 may differ from this composition. For example, when indium is added, the carrier block layer can be grown under lower temperature into the positive type, thus enabling the above layer to be grown on a substrate maintained at a low temperature. This method minimizes potential risk of damaging the active layer 105 on the way of growing crystals. Although the p-type AlGaN carrier block layer 106 may not be provided, presence of this layer 106 lowers current density at a threshold value. This is because the p-type AlGaN carrier block layer 106 functions itself so as to confine carrier component with the active layers 105.

Further, by increasing composite ratio of aluminum in the p-type AlGaN carrier block layer 106, degree of confining carrier in the active layer 105 is favorably promoted. In this case, by further decreasing composite ratio of aluminum down to a critical degree merely capable of sustaining the effect of confining carrier, this in turn causes the mobility of the carrier inside of the p-type AlGaN carrier block layer 106 to be enhanced to result in the lowered electrical resistance. Accordingly, this method is preferred for practical use.

As the n-type AlGaN clad layer 103 and the p-type AlGaN clad layer 108, crystals comprising $Al_{0.1}Ga_{0.9}N$ are used. In place of this, it is also allowable to use ternary crystals comprising AlGaN in which the Al composite ratio is other than 0.1. When raising the composite ratio of aluminum, difference in the energy gap and the refraction index expands from those of the active layer 105 to make it possible to effectively confine carrier and light within the active layer 105, thereby lowering current density at a threshold value in the laser oscillation. Further, by decreasing the composite ratio of aluminum further down to a critical degree capable of merely sustaining the effect of confining carrier and light, it will cause the mobility of the carrier to be enhanced in the n-type AlGaN clad layer 103 and the p-type AlGaN clad layer 108, thereby lowering operating voltage of the corresponding element.

In this case, by arranging film thickness of the n-type AlGaN clad layer 103 in a range from 0.7 μm to 1.5 μm, effect of making the vertical transverse mode single-peaked and efficiency of confining light can be enhanced, thereby enabling to improve optical characteristics of laser and lower current density at a threshold value of laser. In the above example, the above-referred n-type clad layer 103 and the p-type clad layer 108 are respectively constituted into ternary composite crystals comprising AlGaN. Alternatively, it is also possible to prepare the n-type and p-type clad layers 103 and 108 with quaternary composite crystals such as AlInGaN, AlGaNP, or AlGaNAs, for example. Further, in order to lower electric resistance, it is also allowable to constitute the p-type clad layer 108 with a super-lattice structure consisting of a p-type AlGaN layer and a p-type GaN layer or with another super-lattice structure consisting of a p-type AlGaN layer and a p-type InGaN layer.

The above description has solely referred to the method of growing crystals by applying the MOCVD processing device in the course of laminating nitride-composite semiconductor layers on the substrate 10 comprising n-type GaN composite element. Alternatively, it is also possible to introduce a "molecular beam epitaxy" (MBE) method or the above-cited HVPE (hydride vapor phase epitaxy) method.

Through the above serial processes, epitaxial wafers are obtained, which each have the layers of the nitride composite semiconductor on the n-type GaN composite substrate 10. These epitaxial wafers are then extracted from the MOCVD processing device for the ensuing processes for converting them into individual chips of the nitride composite semiconductor laser elements. Note that, as shown in FIG. 2, the p-type $Al_{0.1}Ga_{0.9}N$ clad layer 108 is formed with a projected ridge-stripe configuration, which is complete with a processing step to be described later on.

Except for a local portion right above the growth inhibiting film 13, surface of each epitaxial wafer produced via steps for processing the nitride composite semiconductor elements is fully leveled off. Note that, at a local portion right above the growth inhibiting film 13, the nitride-composite semiconductor layers cannot grow themselves epitaxially, and forms a recess. After completing formation of the nitride-composite semiconductor layers, it was confirmed that no crack was generated on those portions complete with the epitaxial growth (these portions will be referred to as the "epitaxially grown portions hereinafter") except for a local portion right above the growth inhibiting film 13.

It is conceived likely that, since the recessed portion right above the growth inhibiting film 13 relaxes stress, residual stress in the epitaxially grown portion is lowered in the direction perpendicular to the ridge-stripe portion (in the leftward and rightward direction shown in FIG. 2). Further, although the effect of dislocation spreads up to the surface of the GaN composite substrate, due to presence of the growth inhibiting film 13, the effect of dislocation is prevented from further diffusing into the epitaxially grown portion on the GaN composite substrate 10. Accordingly, density of the dislocation is lowered inside of the nitride-composite semiconductor layers further than the case of using a normal GaN substrate 10 without exceeding density of dislocation in the region containing a low degree of defect in the substrate.

It was described earlier that polarity on the surface of the GaN substrate 10 may be inverted so that the nitrogen appears on the surface in the region 11 concentrated with dislocation. However, as a result of initially forming the growth inhibiting film 13 on the region 11 concentrated with dislocation followed by a process for growing nitride semiconductor layers, nitrogen surface coexists on the surface of the GaN substrate 10, thus growth on a normal gallium surface is not retarded. Accordingly, as in the case in which polarity of the region 11 concentrated with dislocation remains without being inverted, as specific characteristics proper to the nitride semiconductor laser element, effect resulted from the decrease of crystalline defect and relaxed stress can be confirmed.

(Process for Conversion into Elements)

A ridge-stripe portion is formed on the surface of flat portion of the nitride composite semiconductor layers in order to confine light in the horizontal direction against the n-type GaN substrate 10. However, when using the n-type GaN substrate containing high luminescence region 25 shown in FIG. 1A to 1D, it is desired that the ridge-stripe portion not be formed right above the high luminescence region 25. This because of the following undesirable reasons. Concretely, it is not desired to cause drive current to flow through the high luminescence region 25 due to the rise of drive current flowing into the nitride semiconductor laser elements and also due to the rise of voltage borne by the elements caused by the rise of resistivity and a less amount or lower degree of activation of dopant in the high luminescence region 25 than that of other regions.

The ridge-stripe portion is formed by executing an etching process from the surface of the epitaxial wafer to an intermediate portion of the p-type AlGaN clad layer 108 except for the striped portion having 1 to 3 µm, preferably 1.3 to 2 µm of width. The distance from the p-type GaN guide layer 107 at the etched bottom surface was arranged to be from 0 to 0.1 µm. In the following step, an insulating film 110 made of AlGaN composite material is formed except for the ridge-stripe portion. Since the p-type GaN contact layer 109 without being subject to the etching process remains exposed, a positive electrode 15 is formed on the surfaces of the p-type GaN contact layer 109 and the insulating film 110 via a vapor-phase deposition process in the sequence of palladium (Pd), molybdenum (Mo), and gold (Au).

Aside from AlGaN, it is also allowable to use any of the following materials for composing the insulating film 110 including oxide or nitride of silicon, titanium, zirconium, tantalum, and aluminum. Further, any of those composite elements including palladium (Pd)/platinum (Pt)/gold (AU), or palladium (d)/gold (Au), or nickel (Ni)/gold (Au), may also be used for composing the positive electrode 15.

Further, by grinding the back surface side (on the substrate side) of the epitaxial wafer provided with the positive electrode 15, thickness of the epitaxial wafer is adjusted to be 80 µm to 200 µm, thereby facilitating division of the epitaxial wafer afterwards.

Next, a negative electrode 16 is formed on the back of the n-type GaN substrate 10 in the sequence of hafnium (Hf) and aluminum (Al). It is allowable to use any of those composite elements cited below for composing the negative electrode 16 including the following: hafnium (Hf)/aluminum (Al)/molybdenum (Mo)/gold (Au), hafnium (Hf)/aluminum (Al)/platinum (Pt)/gold (Au), hafnium (Hf)/aluminum (Al)/tungsten (W)/gold (Au), hafnium (Hf)/gold (Au), hafnium (Hf)/molybdenum (Mo)/gold (Au). It is also allowable to use any of the above-cited composite materials for composing the negative electrode 16 by way of substituting hafnium with titanium (Ti) or zirconium (Zr).

Finally, by causing the epitaxial wafer provided with the negative electrode 16 to be split in the direction perpendicular to the ridge-stripe direction via cleavage, a Fabry-Pérot resonator with 600 µm of resonating length is prepared. It is desired that length of the resonator shall be a minimum of 300 µm to a maximum of 1000 µm. After completing the above serial processes, the epitaxial wafer becomes a bar-like configuration in which individual nitride-composite semiconductor laser elements are aligned in the horizontal direction. An edge surface of the resonator of the nitride semiconductor laser element having its stripe form oriented in the <1-100> direction constitutes the {1-100} surface. Cleavage is not implemented after forming ruled line all over the epitaxial wafer via a scriber, but the cleavage is commenced at an origin after putting ruled lines at both ends of the epitaxial wafer for example via a scriber.

Not only the above-described feedback method based on the edge surface of the resonator by applying the above bar-like Fabry-Pérot resonator, but it is also allowable to apply the "distributed feedback (DFB)" unit provided with a conventionally known diffraction lattice inside of the resonator or the "distributed Bragg reflector (DBR)" unit provided with a diffraction lattice outside of the resonator. After completing a splitting process via cleavage followed by formation of the edge surface of the bar-like Fabry-Pérot resonator, dielectric films composed of $SiO_2$ containing 70% of reflection index and $TiO_2$ are alternately deposited on the edge surface of the resonator via vapor-phase deposition, thus completing formation of multiple dielectric reflection films. It is also allowable to use composite elements such as $SiO_2/Al_2O_3$ for composing the multiple dielectric reflection films.

Figure 3:
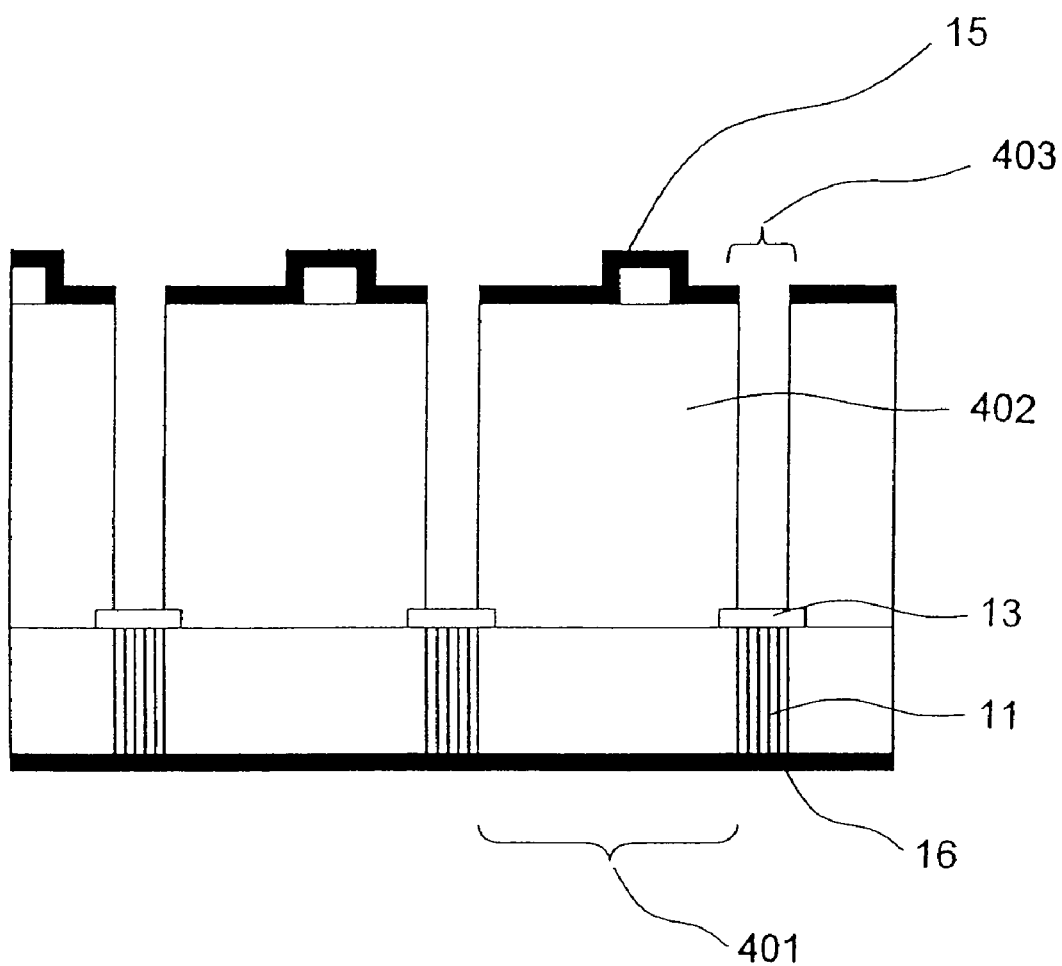
FIG. 3 is a cross-sectional view representing an aspect of the nitride composite semiconductor layers laminated on the n-type GaN composite semiconductor substrate according to the first embodiment of the present invention.

Constitution of the above bar-like Fabry-Pérot resonator is variable by the difference in terms of the film thickness or growth condition of the nitride-composite semiconductor layers laminated on the n-type GaN composite substrate 10, where the growth condition includes substrate temperature during growth and pressure inside of a reaction furnace. For example, if each of the nitride composite semiconductor layers is merely provided with a thin film thickness, then, as shown in FIG. 3, nitride composite semiconductor layers 402 cannot be bonded right above the growth inhibiting films 13, thereby causing region 403 right above the growth inhibiting films 13 to be separated from other portions. A portion formed in a region between the growth inhibiting films 13 constitutes a unit of the nitride-composite semiconductor laser element 401.

Figure 4:
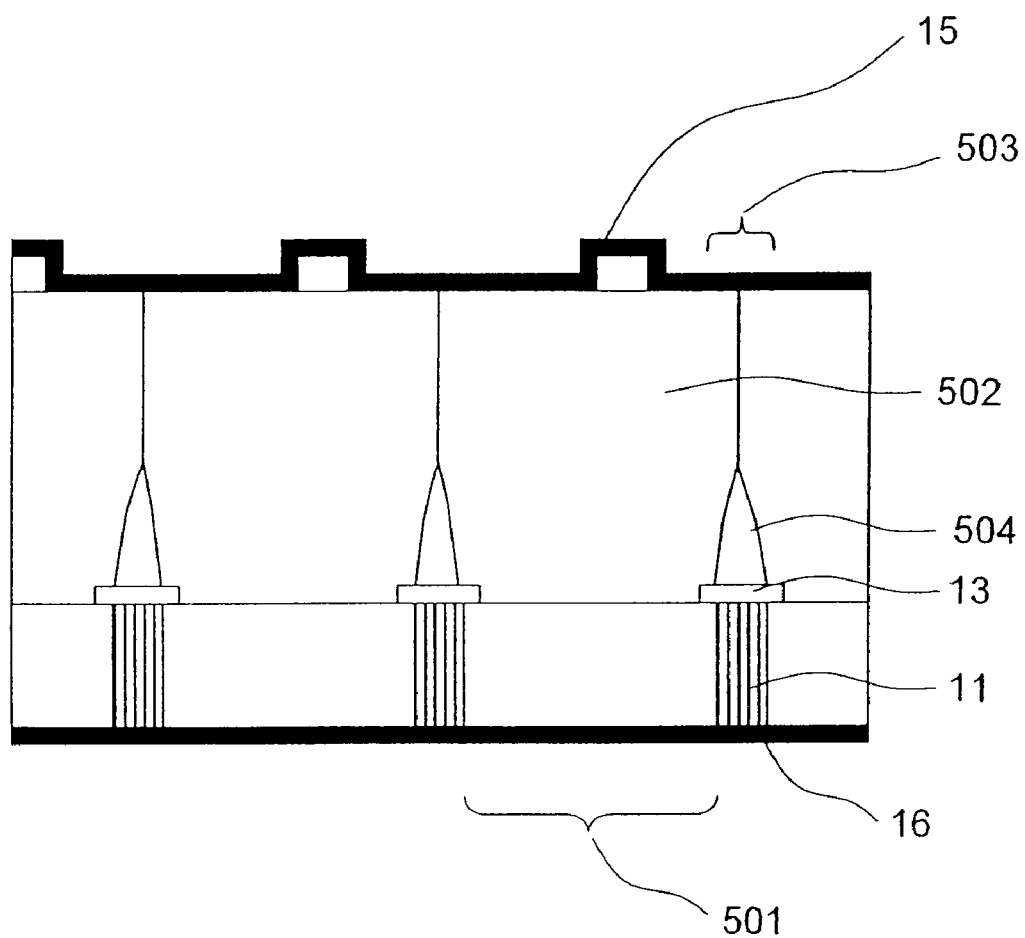
FIG. 4 is a cross-sectional view representing another aspect of the nitride composite semiconductor layers laminated on an n-type GaN composite semiconductor substrate.
Figure 5:
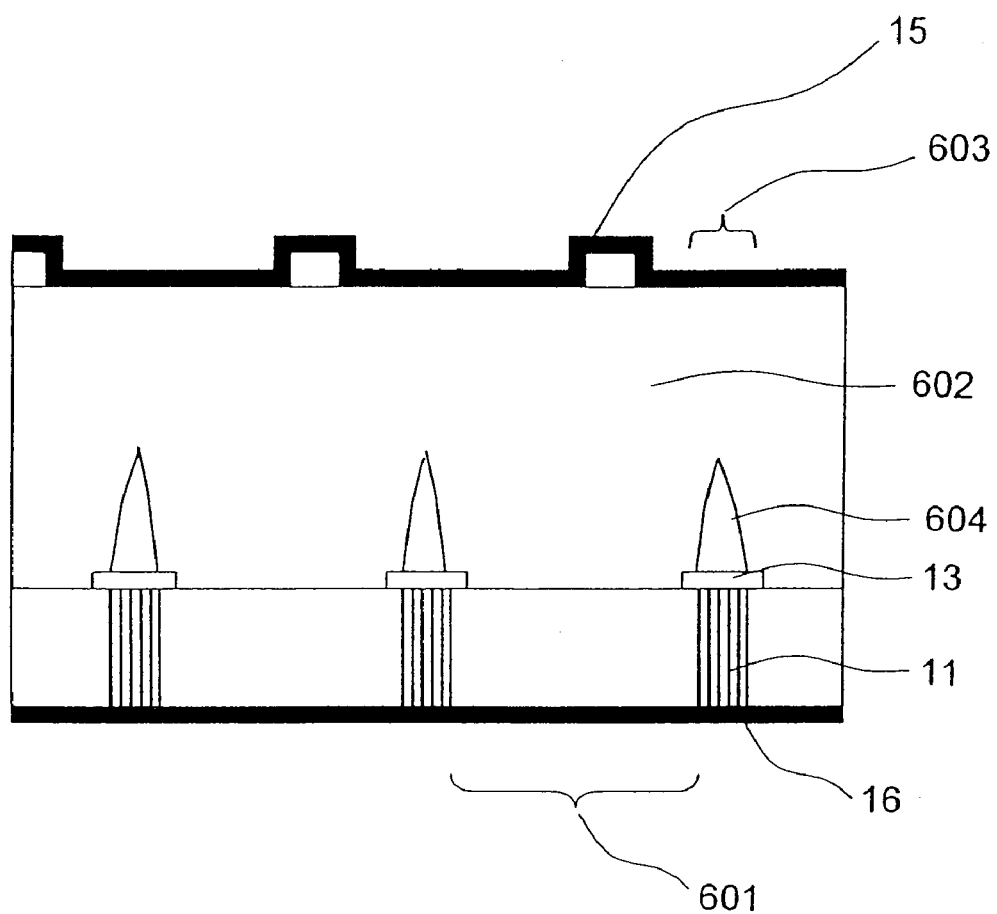
FIG. 5 is a cross-sectional view representing another aspect of the nitride composite semiconductor layers laminated on an n-type GaN composite semiconductor substrate.

When the film thickness of the nitride composite semiconductor layers has been increased from that is shown in FIG. 3, the actual aspect looks like the one shown in FIG. 4 or 5. Concretely, in FIG. 4, although nitride composite semiconductor layers 502 are bonded together right above the growth inhibiting film 13, crack arriving at the surface of the semiconductor layers 502 is present in a region 503 right above the growth inhibiting film 13. Further, as shown in FIG. 4, hollow portion 504 may be generated on the surface of the growth inhibiting film 13 within the region 503. When this condition is present, a portion formed in a region between individual growth inhibiting films 13 constitutes a nitride composite semiconductor laser element 501.

FIG. 5 represents a state in which nitride-composite semiconductor layers 603 are fully bonded with each other right above the growth inhibiting film 13. Accordingly, unlike the one shown in FIG. 4, it is confirmed that no crack is present in a region 603 right above the growth inhibiting film 13 otherwise arriving at the surface of the nitride composite semiconductor layers 602. Further, as shown in FIG. 5, a hollow portion 604 may be generated on the surface of the growth inhibiting film 13 within the region 603. A portion formed in a region between individual growth inhibiting films 13 constitutes a unit of nitrogen composite semiconductor laser element 601.

Then, by causing the above bar-like Fabry-Pérot resonator to be divided, the nitride-composite semiconductor laser elements according to the constitution shown in FIG. 2 are eventually secured. During the dividing process, a laser beam guide region 14 is disposed at the center of the above semiconductor laser elements right beneath the ridge-stripe portion before dividing the above resonator so as to provide each of the semiconductor laser elements with 400 µm of lateral width. Originally, a certain number of specific regions 24 each being concentrated with dislocation is disposed in the n-type GaN substrate 10 at 400 µm of intervals (pitch P) as shown in FIG. 1A to 1D. It is suggested that, when securing the nitride-composite semiconductor laser elements by dividing the above-referred bar-like Fabry-Pérot resonator, it will generate much convenience by dividing lateral width of the semiconductor laser element into the width of 1 for the integral multiple of the pitch P of a dislocation concentrated region, or an integral multiple.

By serially executing the above processes, the nitride composite semiconductor laser element chips as shown in FIG. 2 are thus completed. Accordingly, by applying the n-type GaN substrate 10 with intentional control over the dislocation substantially being crystalline defect contained therein, and further, by fully covering the dislocation concentrated region 11 with the growth inhibiting film 13, a laser beam guide region 14 is formed in the region incurring negligible effect of dislocation and a low degree of stress in order that the laser beam guide region 14 will become a stricture portion of the current flowing through the above semiconductor laser elements. Accordingly, based on the above arrangement, it was eventually possible to sustain more than 5000 consecutive hours of the laser oscillation service life under the condition of 60 mW of laser output power and 70° C. of environmental temperature.

It should be noted that the film thickness of the above growth inhibiting film 13 was rated as 0.2 µm in this embodiment. However, applicable film thickness is not solely limited to this value. A certain number of nitride composite semiconductor laser elements have been formed that have different film thickness of the growth inhibiting film 13 ranging from 0.01 µm up to 2.0 µm. When the growth inhibiting film 13 is less than 0.05 µm of thickness, the growth inhibiting film 13 incurs damage due to the rise of temperature before implementing lamination of the above semiconductor layers, thus failing to secure growth inhibiting effect.

Further, when the growth inhibiting film 13 is thicker than 0.1 µm, due to the difference in the thermal expansion coefficient between the n-type GaN composite substrate 10 and the growth inhibiting film 13, the rise of temperature before laminating the nitride-composite semiconductor layers also causes the growth inhibiting film 13 to incur damage. Even if the growth inhibiting film 13 itself does not incur damage, nitride semiconductor layers directly growing on the surface of the GaN composite substrate 10 other than the growth inhibiting film 13 may be subject to abnormal growth in the vicinity of the height difference between the growth inhibiting film 13 and the GaN composite substrate 10, due to obstruction generated by diffused material caused by presence of the height difference. Generation of this kind of abnormal growth is called "edge effect" Due to generation of the "edge effect", obstruction may be generated during the production processes, or the laser oscillation wave-length may vary. or oscillation threshold value may rise.

Based on the above reasons, after forming the growth inhibiting film 13 by a minimum of 0.05 µm and a maximum of 1 µm, practical effect of the growth inhibiting film 13 can be secured, thus enabling the nitride semiconductor laser elements incorporating the above growth inhibiting film 13 to secure durable service life under high-output ageing.

SECOND EMBODIMENT OF THE PRESENT INVENTION

Referring now to the accompanying drawings, the second embodiment of the nitride semiconductor laser elements manufactured by applying the n-type GaN composite substrate incorporating those regions concentrated with "dislocation" and those high luminescence regions based on the above formation is described below. Processes for epitaxially growing the nitride semiconductor layers and manufacturing laser elements are identical to those which are performed for the first embodiment of the present invention, and thus, for detailed description of these constituents, refer to the preceding description on the first embodiment, thereby omitting description thereof.

In the second embodiment, unlike the preceding first embodiment, a growth inhibiting film is formed in order that those regions 24 concentrated with "dislocation" (shown in FIG. 1A to 1D) can fully covered by the growth inhibiting film, and that the growth inhibiting film can be formed on the n-type GaN composite substrate 10 in the drain-board form. Concretely, as was performed in the first embodiment, initially, an n-type GaN composite substrate 10 is placed inside of an electron-beam-applied vapor-phase deposition device, and then, after enabling the inner pressure to arrive at a specific vacuum degree, by processing silicon dioxide into 0.2 µm of film thickness a $SiO_2$ film is formed on the surface of the n-type GaN composite substrate 10. Next, using a simple lithographic method, as shown in FIG. 6A, the vapor-deposited $SiO_2$ is formed so as to constitute a growth inhibiting film 301 split into three parts across 5 µm of intervals each having 10 µm of width by way of covering those regions 11 concentrated with dislocation on the n-type GaN composite substrate 10.

Figure 6A:
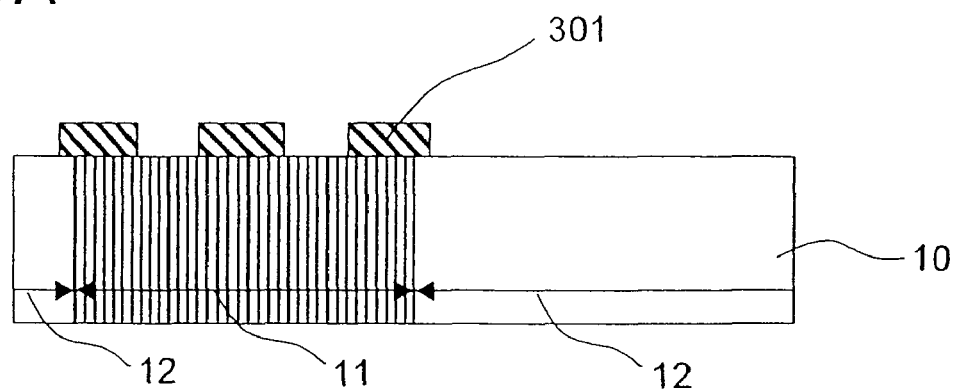
FIG. 6A to FIG. 6C are respectively a cross-sectional view for explanatory of serial steps for growing GaN composite crystals according to a second embodiment of the present invention.
Figure 6B:
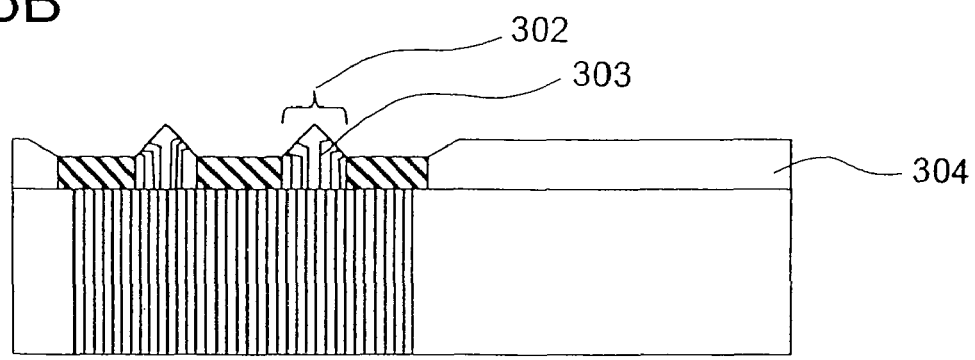

As shown in FIG. 6A, by executing the above serial processes, a plurality of growth inhibiting films 301 each having 0.2 µm of thickness are formed on the regions 11 concentrated with dislocation inside of the n-type GaN composite substrate 10. Next, by applying the MOCVD deposition device, an n-type GaN composite film is formed in presence of normal atmospheric pressure and at 1000° C. of substrate temperature. As a result, as shown in FIG. 6B, GaN composite crystals 302 grow themselves in the direction of [0001] through windows each having 5 µm of opening between a plurality of growth inhibiting films 301. When this condition is present, sectional shape of the GaN composite crystals 302 remains in the projected triangular form. Next, by lowering pressure of a reaction furnace of the MOCVD deposition device to 70 Torr, a process for growing the GaN crystals 302 is implemented again at 1080° C. of the substrate temperature.

When the above process is underway, the n-type GaN composite crystals 304 shown in FIG. 6B correspond to the portions grown from bare portion without being covered by the growth inhibiting films 301. The inner portion of the corresponding n-type GaN composite film 304 merely contains a specific density of dislocation substantially corresponding to that is present in those regions other than those regions 11 concentrated with dislocation inside of the n-type GaN composite substrate 10. The GaN composite crystals 302 contains the dislocation 303 which is present in succession to the parallel direction against the growth axis in the direction of [0001]. However, when the growth begins in the lateral direction perpendicular to the growth axis in the direction of [0001], the dislocation 303 bends itself in the direction perpendicular to the direction [0001]. At the same time, (11-22) and (−1-122) facets grow themselves as the foremost tip portions.

Figure 6C:
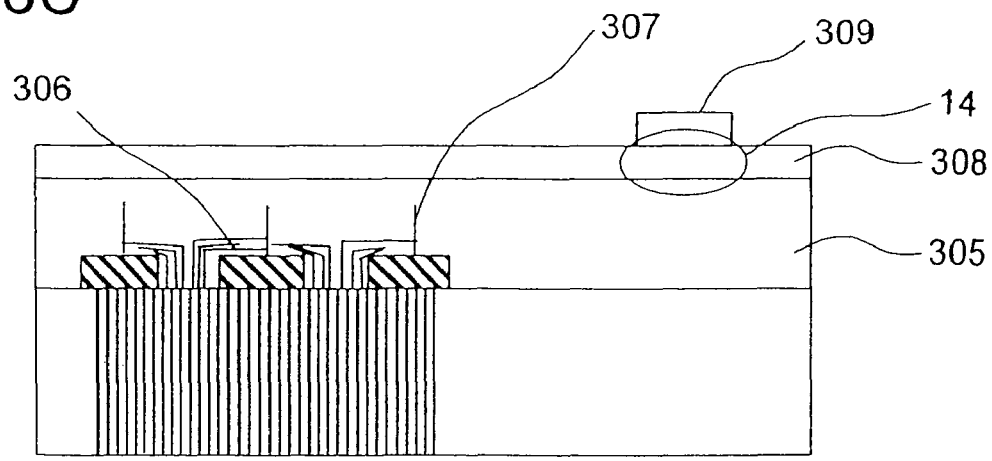

Thus, lateral directional growth is promoted from the portion at which the GaN composite crystals grew themselves in the form of projection as shown in FIG. 6C, and then, as shown in FIG. 6C, the GaN composite crystals are united together at the center portion right above the growth inhibiting films 301 and further grow themselves upward. Further, by causing an n-type GaN composite film 304 containing low-dislocation regions to be grown in the lateral direction, an n-type GaN composite film 305 is formed, which covers a GaN epitaxial film generated via the growth of the projected GaN composite crystals 302. The GaN epitaxial layer covered with the n-type GaN composite film 305 incorporates a dislocation 306 bent via the lateral-directional growth. Further, a slight amount of dislocation concentrates into a junction portion 307 linked with the GaN composite crystals 302 and the n-type GaN composite film 304 as a result of the lateral-directional growth.

The above art was described in the paper prepared for the 22nd and 171st joint meeting of two committees of Japan Society for the Promotion of Science, namely No. 162 Short-Wavelength Optical Device Committee and No. 125 Photoelectric Conversion Committee (Dec. 15 to 16, 2000), on pages 25 to 32.

After growing the GaN composite crystals on the surface of the n-type GaN composite substrate 10, the surface of the GaN composite film 305 with a sum of approximately 8 µm of film thickness was fully leveled off. After growing the n-type GaN composite film 305, by applying the method identical to that was applied to the first embodiment, layer structure for constituting the nitride semiconductor laser element was serially grown via crystalline formation. Consequently, the nitride semiconductor layers 308 were eventually formed on the n-type GaN composite film 305.

After executing a final etching process, a ridge stripe portion 309 was formed so as to complete a laser element. The position for forming the ridge stripe portion 309 in the nitride semiconductor laser element may be provided above those local regions 12 accommodating low-density dislocation other than the regions right above those regions 11 concentrated with dislocation, or it may be provided right above the growth inhibiting film 303. By virtue of the above arrangement, after executing the second embodiment, as a result of the lowered crystalline defect and the relaxed stress, it was possible to secure such nitride semiconductor laser elements incorporating as satisfactory physical characteristics as that was secured by execution of the first embodiment.

In the second embodiment, width of the growth inhibiting film 301 is defined to be 10 µm and the intervals between individual growth inhibiting films to be 5 µm. It should be noted that, insofar as the given width and intervals enable selective growth and lateral directional growth of the growth inhibiting film 301, superiority in terms of characteristics of the nitride semiconductor laser element can be admitted. It was confirmed that, when the width given to the growth inhibiting film 301 and the intervals between adjoining growth inhibiting film were respectively a minimum of 1 µm and a maximum of 10 µm, it was possible to secure such a nitride semiconductor laser element with the most desirable characteristics. The thickness of the GaN composite film 305 formed for covering the growth inhibiting film 301 is defined to be 8 µm. However, by arranging the thickness of the GaN composite film 305 in a range from 1 µm to a maximum of 20 µm, it is possible to lower the influence of the growth inhibiting film 301 against the laminated nitride semiconductor layers.

Further, the second embodiment has introduced silicon dioxide for constituting the growth inhibiting film 301. However, as was allowed in the first embodiment, it is also possible to use other silicon compound such as $Si_3N_4$ or metallic element such as tungsten (W) or titanium (Ti) or the like. Further, although thickness of the growth inhibiting film 301 for covering the substrate was defined to be 0.2 µm, it is also allowable to provide 0.05 µm up to a maximum of 1 µm of its thickness. Further, the drain-board shaped growth inhibiting film 301 is so arranged that the width corresponding to the sum of the width itself and intervals between adjoining growth inhibiting films 301 can fully cover all the underlying regions 11 concentrated with the dislocation.

The present description on the first and second embodiments of the invention has thus far solely referred to the ridge-stripe type nitride semiconductor laser elements. However, scope of the first and second embodiments is not solely limited to the above ridge-stripe type. The description has also referred to an example of forming electrodes on the back surface of the n-type GaN composite substrate 10 and on the front surface of a nitride semiconductor film formed on the surface of the n-type GaN composite substrate. Alternatively, it is also allowable to form the p-type and n-type electrodes on the surface of the n-type GaN composite substrate 10.

[The Case in which an Elementary Group of As, P, and Sb, is Included in the Active Layer]

The semiconductor laser element having the constitution shown in FIG. 2 manufactured via the processes according to the first or second embodiment of the present invention consists of the laminate of an InGaN composite well layer and an InGaN composite barrier layer for constituting the active layer 105. The active layer 105 may include at least any of the elements among an elementary group including arsenic (As), phosphor (P), and antimony (Sb).

In this case, it is so arranged that at least any of the elements among an elementary group including As, P, and Sb, be included in the well layer among the active layer 105 constituting the above nitride composite semiconductor laser element. In this case, assume that the composite ratio of a sum of the elementary group comprising As, P, and Sb included in the well layer is defined as "X", whereas the composite ratio of nitrogen element is defined as "Y", it is so arranged that X is smaller than Y, and yet, X/(X+Y) is less than or equal to 0.3. It is further preferred that X/(X+Y) be less than or equal to 0.2.

The lower limit value of the sum of the elementary group is defined to be a minimum of $1\times10^{18}$ cm$^{-3}$. If the composite ratio X of the sum of the above elementary group becomes higher than 0.2, concentration separation, i.e., a phenomenon in which the composition of the above-mentioned elements varies from one region to another within the quantum well layer, starts to occur. Further, if the composite ratio of the sum of the above elementary group becomes higher than 0.3, it will cause the above concentration separation to shift to the crystalline separation causing hexagonal crystals and cubic crystals to be intermingled with each other, thereby lowering the crystallization effect of the well layer. On the other hand, if the sum of the above elements added to the well layer is less than $1\times10^{18}$ cm$^{-3}$, it will become difficult to secure proper effect of including the above elements in the well layer.

As described above, by causing As, P, and Sb, to be included in the active layer 105, effective mass of electrons and holes of the well layer decreases, and conversely, mobility of electrons and hole of the well layer increases. Accordingly, in the case of the nitride composite semiconductor laser element, decrease of the effective mass of electrons and holes of the well layer enables to secure inverted distribution of carrier for the laser oscillation by feeding a small amount of current. Further, increase of the mobility of electrons and holes of the well layer generates such an effect of enabling electrons and holes to diffuse themselves over again and then infused into the well layer at a high velocity even after electrons and holes were subject to extinction in the well layer once due to generation of illuminant reunion.

It is known that the above advantageous effects appear most conspicuously when crystalline defect is not present in the quantum well. Concretely, in contrast with such an InGaN composite nitride semiconductor laser element devoid of any elementary constituent in the active layer 105, by causing any of the elements As, P, or Sb, to be included in the active layer 105, it is possible to produce quality nitride composite semiconductor laser element featuring low threshold current density and excellent self-excited oscillation characteristics, i.e., excellent in the noise suppression characteristics.

In the first and second embodiment, prior to the epitaxial growth of the nitride composite semiconductor layers, a growth inhibiting film is formed by way of covering the dislocation concentrated regions on the surface of the GaN composite substrate. However, in the following embodiments described hereinafter, the epitaxial growth of the nitride composite semiconductor layers is solely implemented without forming the growth inhibiting film on the surface of the GaN composite substrate. However, in order to prevent the influence of the dislocation concentrated regions inside of the GaN composite substrate from adversely affecting the laser beam guide region, a specific relationship is arranged at a relative position between them.

THIRD EMBODIMENT OF THE PRESENT INVENTION

Figure 7:
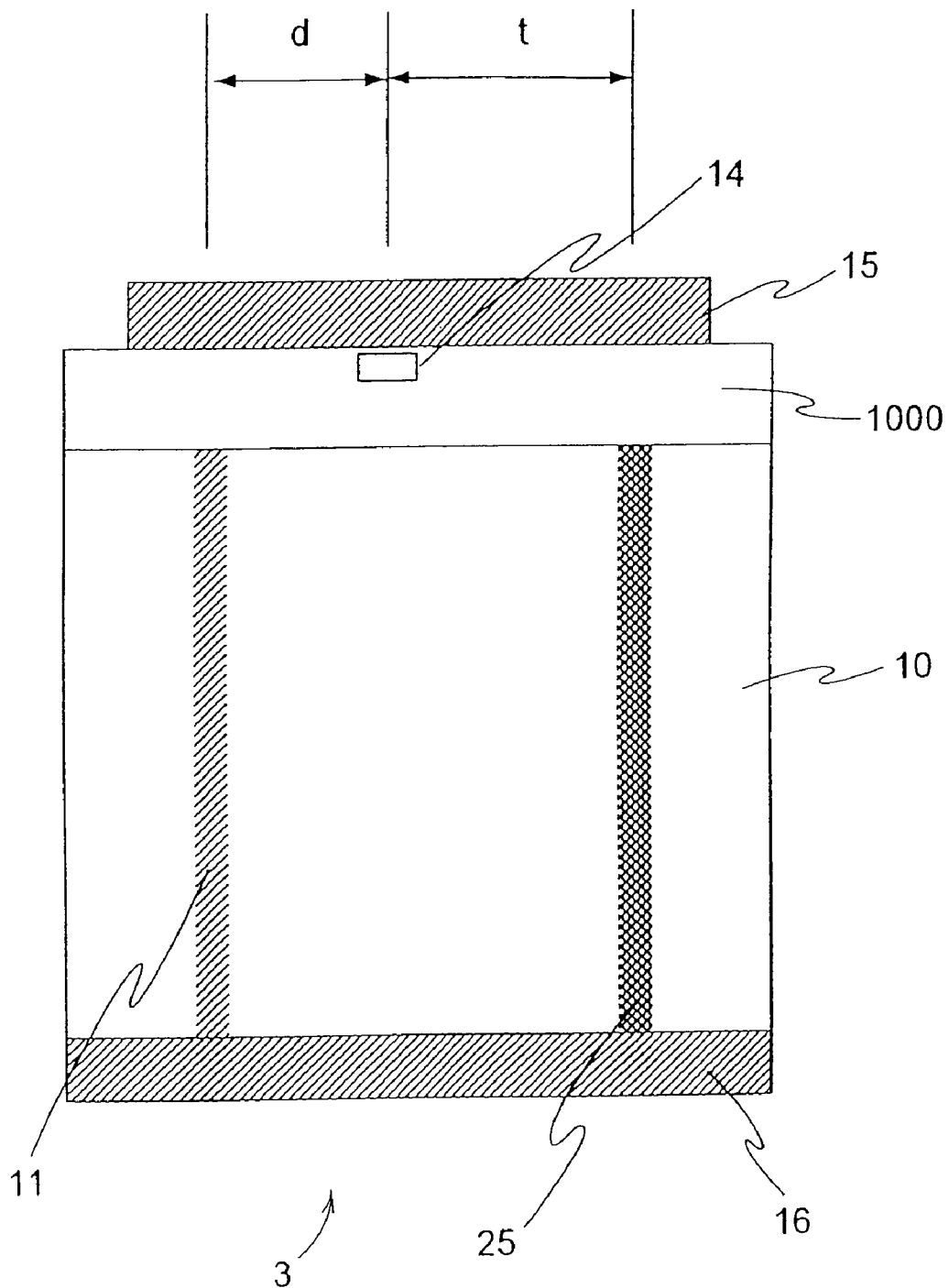
FIG. 7 is a vertical cross-sectional view for schematically showing the constitution of a semiconductor laser element according to a third embodiment of the present invention.

FIG. 7 is a schematic cross-sectional view of a semiconductor laser element 3 according to the third embodiment of the present invention. In FIG. 7, the semiconductor laser element 3 of the third embodiment is seen from the light emitting direction. The reference numeral 10 represents an n-type GaN composite substrate, in which a number of dislocation concentrated regions 11 are present. Those portions other than the dislocation concentrated region 11 consist of low-dislocation accommodating regions. Intervals (pitch P) between individual regions 11 are respectively at 400 μm. Within the low dislocation regions, high luminescence regions 25 are present in parallel with the regions 11. A number of nitride semiconductor (epitaxially grown) layers 1000 are formed on the substrate 10. A laser beam guide region 14 is disposed inside of the nitride semiconductor layers. An electrode 15 is formed on the upper surface of the nitride semiconductor layers 1000, whereas the other electrode 16 is disposed beneath the substrate 10. Although not shown in this cross-section view, the dislocation concentrated regions 11, the high-luminescence regions 25 and the laser beam guide region 14, are respectively extended into the depth direction of FIG. 7, which are disposed substantially in parallel with each other.

According to a plan view of the semiconductor laser element 3 of the third embodiment, the distance (d) between the laser beam guide region 14 and the dislocation concentrated region 11 is defined at 80 μm, whereas the distance (t) between the laser beam guide region 14 and the high-luminescence regions 25 is defined at 120 μm. In the present specification, the distances "d" and "t" shall respectively be determined by referring to the distance between the center positions of the stripe-form laser beam guide region 14, regions 11 concentrated with dislocation, and the high-luminescence regions 25. Further, in the following embodiments, the center portion corresponding to the high-luminescence regions 25 within the low-dislocation region will be referred to as the "center portion of the low dislocation region". It is possible to consider those portions described as the high luminescence regions 25 by replacing with the "center portion of the low dislocation region".

[Epitaxial Growth of Nitride Semiconductor Layers]

Figure 8:
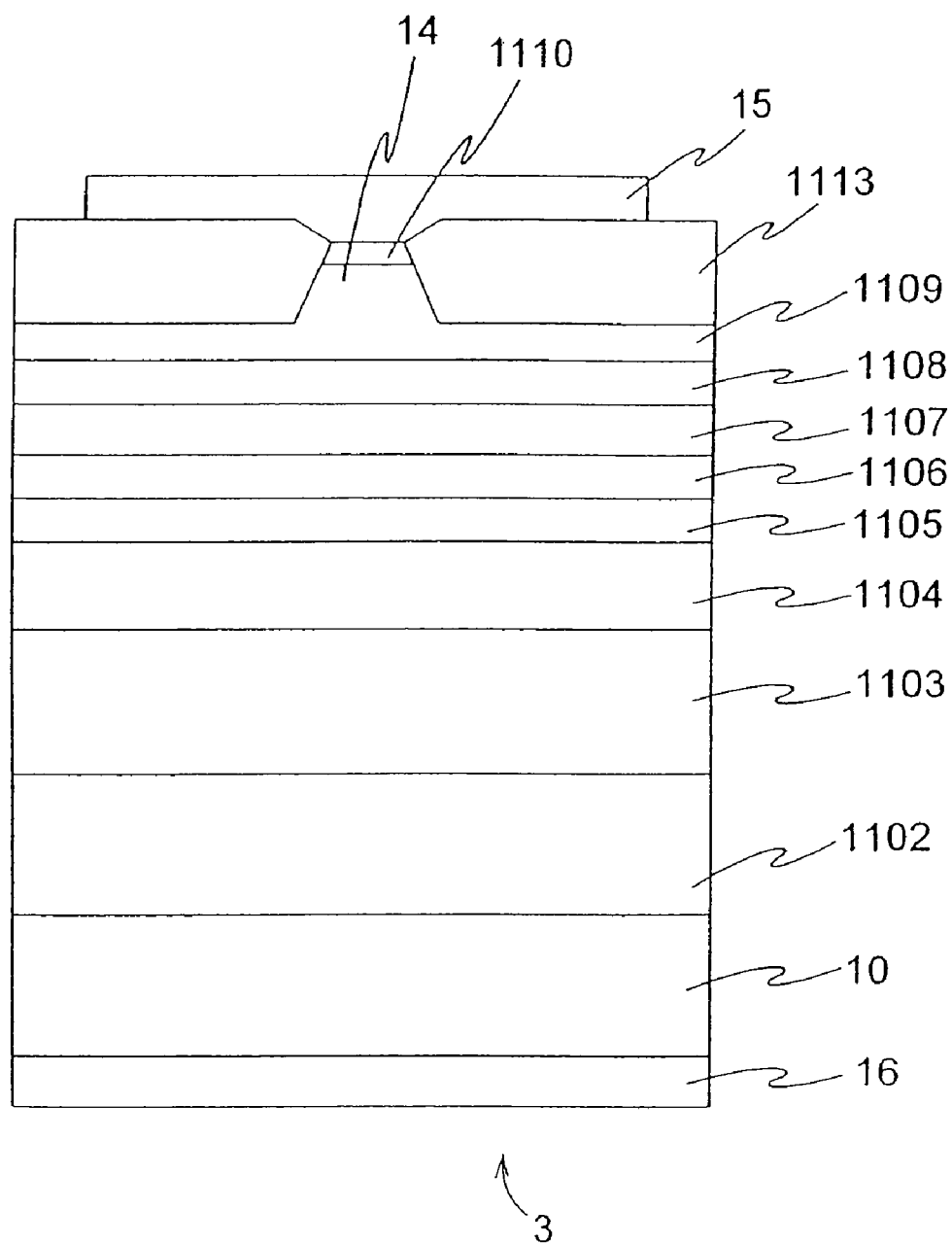
FIG. 8 is a vertical cross-sectional view for schematically showing the stratum constitution of the semiconductor laser element according to the third embodiment of the present invention.

Referring now to FIG. 8, a method of manufacturing the semiconductor laser element 3 by forming nitride semiconductor layers 1000 on an n-type GaN composite substrate 10 is described below. Note that FIG. 8 is a schematic diagram for representing the detail of the layer constitution of the nitride semiconductor layers 1000 by referring to the semiconductor laser element shown in FIG. 7. Note further that, since the constitution and the method of manufacturing the GaN composite substrate 10 have previously been described, further description on the constitution of the substrate 10 is deleted.

Initially, using an MOCVD deposition device, dopant material composed of $SiH_4$ was added to $NH_3$ which is the V family source and TMGa (trimethyl gallium) or TEGa (triethyl gallium) which is the III family source. Next, an n-type GaN composite layer 1102 having 3 μm of film thickness was formed on an n-type GaN substrate 10 at 1050° C. of the substrate temperature. Next, TMIn (trimethyl indium) as the III family source was added to the above compound material to form an n-type $In_{0.07}Ga_{0.93}N$ crack-preventing layer 1103 by 40 nm via growth. Next, the substrate 10 was heated up to 1050° C., and then, using TMAl (timethyl aluminum) or TEAl (triethyl aluminum) as the III family source, an n-type $Al_{0.1}Ga_{0.9}N$ clad layer 1104 having 1.2 μm of thickness was formed via growth. In this process, impurities consisting of silicon were added by an amount corresponding to $5\times10^{17}$ $cm^{-3}$ to $1\times10^{19}$ $cm^{-3}$. Next, an n-type GaN composite beam guide layer 1105 was formed by 0.1 μm of thickness via growth by adding silicon impurities by an amount corresponding to $1\times10^{16}$ to $1\times10^{18}$ $cm^{-3}$.

Next, the substrate temperature was lowered to 750° C., and then active layer 1106 consisting of multiple quantum well was formed. This layer includes a barrier layer, a well layer, a barrier layer, a well layer, a barrier layer, well layer, and a barrier layer, and thus has tertiary periodicity. The well layers are $In_{0.1}Ga_{0.9}N$ with 4 nm of thickness, and the barrier layers are $In_{0.01}Ga_{0.99}N$ with 8 nm of thickness. During the growing process, $SiH_4$ was added to the barrier layers or both the barrier layers and the well layers, where concentration of the impurities comprising silicon was rated at $1\times10^{16}$ to $1\times10^{18}$ $cm^{-3}$. If the growth process were suspended for a duration of 1 second up to 180 seconds between the barrier layer and the well layer or between the well layer and the barrier layer, levelness of individual layer is promoted and causes the width of luminescence half value to be decreased favorably.

When adding arsenic (As) to the active layer, it is recommended to add arsine ($AsH_3$) or TBAs (tertiary butyl arsine). When adding phosphor to the active layer, it is recommended to add $PH_3$ (phosphine) or TBP (tertiary butyl phosphine). When adding antimony (Sb) to the active layer, it is recommended to add TMSb (trimethyl antimony) or TESb (triethyl antimony). Further, when forming the active layer, it is allowable to use, instead of $NH_3$, $N_2H_4$ (hydrazine), or $C_2N_2H_8$ (dimethyl hydrazine), or any other organic material containing nitrogen may be used for sufficing nitrogen material.

Next, the substrate 10 was again heated up to 1050° C., so as to enable those layers described below to be grown in the sequence of the following: a p-type carrier block layer 1107 comprising $Al_{0.3}Ga_{0.7}N$ having 20 nm of thickness, a p-type GaN composite beam guide layer 1108 having 0.1 μm of thickness, a p-type $Al_{0.1}Ga_{0.9}N$ clad layer 1109 having 0.5 μm of thickness, and a p-type GaN composite contact layer 1110 having 1 μm of thickness, respectively. To suffice the p-type impurities, $EtCP_2Mg$ (bis-ethyl cyclopentadienyl magnesium) was used, and magnesium was added to the above layers by an amount expressed as $1\times10^{18}$ $cm^{-3}$ to $2\times10^{20}$ $cm^{-3}$. It is desired that the density of the p-type impurities added to the p-type GaN contact layer 1110 be incremental in the direction of the positive electrode 15. This arrangement will cause the contact resistance caused by provision of the positive electrode 15 to be lowered. Further, in order to remove residual hydrogen in the p-type layers obstructing activation of magnesium functioning as p-type impurities, it is allowable to infuse a minimal amount of oxygen into the p-type layers on the way of growing themselves.

After causing the p-type GaN contact layer 1110 to be grown by executing the above serial processes, atmosphere inside of the reactor of the MOCVD deposition device was fully replaced with nitrogen carrier gas and $NH_3$ and then lowered inner temperature by 60° C. per minute. When the substrate temperature reached 800° C., supply of $NH_3$ gas was discontinued, and then the substrate was held on at 800° C. for 5 minutes before being lowered to room temperature. It is desired that the intermediate substrate temperature be held on in a range from 650° C. up to 900° C. for a minimum of 3 minutes up to a maximum of 10 minutes. Preferably, the substrate temperature be lowered at a rate of 30° C. per minute or higher.

The grown film was then evaluated by applying the Raman measuring method. It was confirmed that characteristics proper to conversion into the positive polarity was evidenced (in other words, it was found that magnesium component was activated) immediately after completing the layer growth even when omitting an annealing process for conversion into the positive polarity after extracting the produced wafer from the MOCVD deposition device. It was further confirmed that the contact resistance value caused by formation of the positive electrode was lowered. By combining the above processing steps with the conventional annealing process for conversion into the positive polarity, efficiency in the activation of magnesium component was further promoted favorably.

In the crack-preventive layer 1103 comprising $In_{0.07}Ga_{0.93}N$, it is allowable to arrange the In composite ratio into any value other than 0.07, and further, it is allowable to omit the InGaN crack preventive layer 1103 itself. However, if the lattice incompatibility between the clad layer 1104 and the GaN composite substrate 10 becomes excessive, it is recommended that the InGaN crack preventive layer 1103 be inserted between them for preventing crack from occurrence. Further, in order to prevent crack from occurrence, it is preferred to use germanium in place of silicon for constituting the n-type impurities in the above respective n-type layers.

The active layer 1106 are initially composed of a barrier layer and completed with formation of the last barrier layer. Instead of this arrangement, it is also allowable to constitute the active layer 1106 by initially laying a well layer and completing with the last well layer. Further, not only the above-cited 3 layers, but the number of the well layers may be a maximum of 10 layers. This is because, provision of a maximum of 10 of the well layers lowered threshold current density and enabled continuous oscillations at room temperature. Especially, when 2 layers up to 6 layers of the well layer were provided, the threshold current density was noticeably lowered as a desirable factor. Note further that aluminum component may also be included in the above active layer.

Although the above-described constitution added a specific amount of silicon impurities to both the well layers and the barrier layers jointly constituting the active layer 1106, impurities may not always be added thereto. However, it was proven that luminous intensity was noticeably promoted when impurities comprising silicon were added to the active layer 1106. Not only silicon, but any of those elements including oxygen, carbon, germanium, zinc, and magnesium, or combination of more than two of them may also be used. It was found that approximately $1\times10^{17}$ to $8\times10^{18}$ cm$^{-3}$ in terms of the sum of added impurities was favorable. It should be noted that the object of adding impurities is not always defined to be both the well layers and the barrier layers, but it is also allowable to add impurities to either of them.

The p-type carrier block layer 1107 may not always be composed of $Al_{0.3}Ga_{0.7}N$. By adding indium to the AlGaN composite element, conversion into the positive polarity can be promoted via growth under lower temperature, thereby minimizing damage incurred to the above active layer 1106 on the way of growing crystals. Although the carrier block layer 1107 itself may be omitted, incorporating the carrier block layer 1107 lowered the threshold current density. This is because the carrier block layer 1107 functions so as to confine carrier in the active layer 1106. By lifting the Al composite ratio in the carrier block layer 1107, practical effect of confining the carrier is enhanced favorably. Further, by decreasing the Al composite ratio down to a critical limit just enough to confine the carrier, mobility of the carrier inside of the carrier block layer 1107 is promoted to cause the electrical resistance to be lowered favorably.

The above p-type clad layer 1109 and the n-type clad layer 1104 are respectively composed of crystals comprising $Al_{0.1}Ga_{0.9}N$. Instead, it is also allowable to prepare tertiary crystals comprising AlGaN having the Al composite ratio other than 0.1. By increasing the composite crystalline ratio of aluminum, difference in the energy gap and the difference in the refraction index from that of the active layer 1106 respectively expand, thus enabling the carrier and light to be confined in the active layer 1106 effectively, and yet, enabling to lower the current density at the threshold value of the laser oscillation. Further, by decreasing the Al composite ratio down to a critical limit just enough to continuously confine the carrier and light, mobility of the carrier in the clad layers 1104 and 1109 is promoted, thereby making it possible to lower operating voltage of the semiconductor laser element. Taking this into account, it is desirable to arrange the Al composite ratio in the p-type clad layer 1109 in a range from 0.06 to a maximum of 0.09.

Desirably, thickness of the n-type AlGaN clad layer 1104 shall be defined in a range from 0.7 μm to a maximum of 1.5 μm. By way of forming the suggested thickness, effect of making the vertical transverse mode single-peaked and the effect of confining light are enhanced, thus making it possible to improve optical characteristics of laser and lower the current density of the threshold value of laser.

The above-referred clad layers 1104 and 1109 are respectively composed of tertiary composite crystals comprising AlGaN. However, the clad layers 1104 and 1109 may also be composed of quaternary composite crystals comprising AlInGaN, AlGaNP, AlGaNAs, or the like for example. Further, in order to lower electric resistance, the p-type clad layer 1109 may consist of a super-lattice structure comprising a p-type AlGaN layer and a p-type GaN layer, or another super-lattice structure comprising a p-type AlGaN layer and a p-type AlGaN layer, or another super-lattice structure comprising a p-type AlGaN layer and a p-type InGaN layer.

The above description has solely referred to the crystalline growth method by applying the MOCVD deposition device. However, it is also allowable to apply either the molecular beam epitaxial (MBE) growth method or the hydride vapor phase epitaxy (HVPE) method as well.

Inasmuch as the steps for processing an epitaxial wafer into individual chips of the nitride composite semiconductor laser element have already been described in detail, further description thereof is omitted. Note that, in the course of processing the epitaxial wafer, the lateral width (length in the direction perpendicular to the laser beam guide region 14) W of the semiconductor laser element 3 was arranged to be 400 μm.

The above-described dislocation concentrated regions 11 are respectively disposed inside of an original n-type GaN composite substrate 10 across pitch P=400 μm. A high-luminescence region 25 is disposed at the center of the individual regions accommodating low dislocation. Further, as described earlier, by arranging the distance (d) between the laser beam guide region 14 and the dislocation concentrated region 11 to be 80 μm and the distance (t) between the laser beam guide region 14 and the high luminescence region 25 to be 120 μm, an individual semiconductor laser element in the form of a chip includes a single line of the region 11 concentrated with dislocation and a single line of the high luminescence region 25. Concretely, in this embodiment, the lateral width W=Pitch P, where 2 (t+d)=P.

(Characteristics of the Semiconductor Laser Element)

Since the nitride composite semiconductor laser element 3 related to this embodiment incorporates a current contracting portion at an optimal position, the semiconductor laser element 3 proved to have attained more than 5000 consecutive hours of laser oscillation service life under an experimental condition at 60 mW of laser output and 70° C. in the environmental atmosphere. Incidentally, as a result of a comparative experiment based on the identical condition executed against samples of semiconductor laser element manufactured by applying a conventional technique, the comparative samples merely withstood approximately 1000 consecutive hours of own service life.

(Positional Relationship Between the Laser Beam Guide Region and the Substrate)

As described earlier, the nitride composite semiconductor substrate 10 according to this embodiment is characterized by the constitution incorporating stripe-form regions concentrated with dislocation, discrete regions accommodating low density dislocation, highly luminescent regions, or the center portion of the low-density dislocation region. Further, the above described manufacturing method also features the present invention. In the course of manufacturing the nitride composite semiconductor laser element using the above nitride composite semiconductor substrate, inventors of the present invention detected that, depending on the local position to be determined for the formation of the laser beam guide region of the nitride composite semiconductor laser element on the substrate, the laser oscillation service life was variable. A preferable range of the above-referred distances "d" and "t" is described below.

Figure 9:
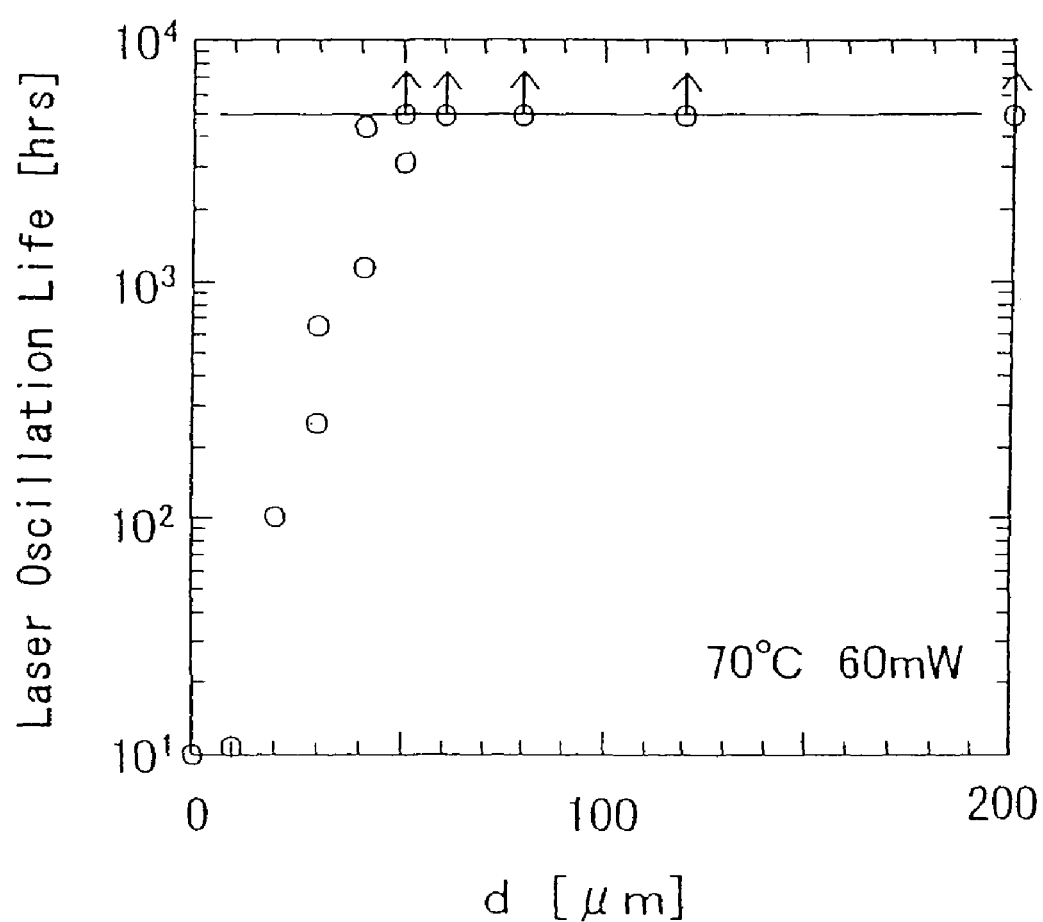
FIG. 9 is a chart for explanatory of the relationship between the distance between the laser beam guide region and the region concentrated with dislocated defective crystals and the laser oscillating life in the nitride composite semiconductor laser element related to the third embodiment of the present invention.

FIG. 9 presents a graphic chart, which was plotted after executing the following processes described below. Initially, a certain number of semiconductor laser elements each having the laser beam guide regions 14 at changed positions were manufactured on an n-type GaN substrate 10 having P=600 μm of pitches by applying substantially the same method as performed for the semiconductor laser element 3 of this embodiment, and then, the laser oscillation service life was measured via plotting against the distance "d" between the laser beam guide region 14 and the dislocation concentrated region 11. The measured result is plotted in FIG. 9. The maximum value of the distance "d" was 200 μm. The measured result was evaluated based on the condition of using 60 mW of the laser output at 70° C. in the environmental atmosphere. In consequence, it was confirmed that, when the distance "d" was longer than or equal to 40 μm, 3000 consecutive hours of practical service life was achieved, and further, when the distance "d" was longer than or equal to 60 µm, more than 5000 consecutive hours of practical service life was secured, thus acquiring sufficiently durable characteristics. Note that the measurement of service life was carried out for a period up to 5000 consecutive hours. The upward arrowed marks shown in FIG. 9 respectively indicate that the laser oscillation service life is extensible beyond 5000 consecutive hours.

When the distance "d" is shorter than or equal to 10 µm, the laser beam guide region 14 is generally positioned above the dislocation concentrated region 11. In this condition, the laser oscillation characteristics extremely degraded own service life to be less than several hours. When the above distance "d" ranges from 20 µm to 30 µm, it was noted that the drive current gradually rose relative to the elapse of time, and then, when the drive current reached approximately 200 mA, due to thermal runaway, laser oscillation became no longer possible. Further, as a result of evaluating leak current from the p-n junction by adding inverse bias current to the p-n junction, compared to such a laser element having the distance "d" between the laser beam guide region 14 and the dislocation concentrated region 11 being longer than or equal to 60 µm, it was confirmed that the laser element causing the drive current to gradually rise apparently generated substantial leak current which was incremental relative to the elapse of time.

In the case of such a semiconductor laser element formed in the vicinity of the dislocation concentrated region 11 of the GaN composite substrate 10 prepared via the above processes, because dislocation (defect) has been generated at a p-n junction close to the laser beam guide region 14, or because the p-n junction surface remains irregular without levelness caused by generation of the above defect, leak current which is incremental relative to the elapse of the driving time has been generated, thereby presumably causing the life characteristics to have been degraded. In consequence, it was found to be necessary to set the distance "d" at least to be longer than or equal to 40 µm, preferably to be longer than or equal to 60 µm.

Figure 10:
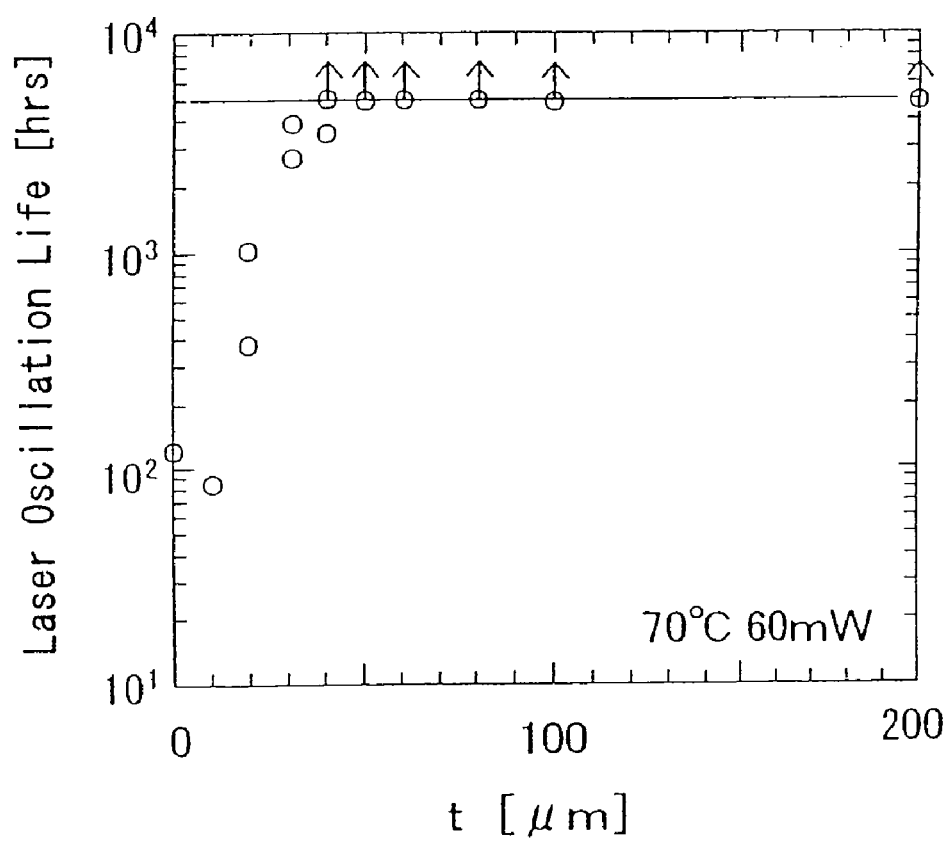
FIG. 10 is a chart for explanatory of the relationship between the distance between the laser beam guide region and the high luminescence region and the laser oscillating life in the nitride composite semiconductor laser element related to the third embodiment of the present invention.

FIG. 10 presents a graphic chart, which was plotted after executing the following processes. Initially, a certain number of semiconductor laser elements each having the laser beam guide regions 14 at changed positions were manufactured on an n-type GaN composite substrate 10 having P=600 µm of pitches by applying substantially the same method as performed for the semiconductor laser element 3 of this embodiment, and then, the laser oscillation service life was measured via plotting against the distance "t" between the laser beam guide region 14 and the high luminescence region 25. The maximum value of the distance "t" was 200 µm. The measured result was evaluated based on the condition of using 60 mW of the laser output at 70° C. in the environmental atmosphere. As a result, it was confirmed that, when the distance "t" was longer than or equal to 30 µm, more than 3000 consecutive hours of practical service life was achieved, and further, when the distance "t" was longer than or equal to 50 µm, more than 5000 consecutive hours of practical service life was secured, thus acquiring sufficiently durable characteristics. Note that, like the one shown in FIG. 9, the upward arrowed marks shown in FIG. 10 respectively indicate that the laser oscillation service life is extensible beyond 5000 consecutive hours.

When the distance "t" is 0 µm, the laser beam guide region 14 is positioned above the high-luminescence region 25. In this case, it was detected that characteristics were degraded down to approximately 100 hours of service life. When the laser beam guide region 14 was disposed in the vicinity of the high-luminescence region 25, voltage of the semiconductor laser element and the drive current value rose, and thus, it was conceived that the rise of the voltage of the laser element and the drive current value caused the service life of the laser element to be degraded. There are some regions containing higher resistance values than that of peripheral portions in the high-luminescence region 25 (or in the center portion of low-dislocation region) and nearby portions within the substrate 10. It is thus conceived that the presence of the higher resistance regions adversely affected the voltage of the laser element. In the close observation of the voltage of the laser element, voltage is substantially constant when the distance "t" is longer than or equal to 50 µm. However, the voltage slightly rises in such a region where the distance "t" is less than 50 µm. As a result, it was concluded that at least "t"≧30 µm, preferably "t"≧50 µm should essentially be provided.

(Preferable Range of the Substrate)

Next, preferable range of pitch P capable of causing the spheres 11 concentrated with dislocation to appear in the GaN composite substrate 10 was studied. As described earlier, it is quite essential that, in the course of manufacturing the GaN composite substrate 10, while exposing the facet {11-22}, sectional form of the surface be provided with saw-teethed projections and recesses. As a result of this arrangement, it is possible to generate the low-dislocation regions and the high-luminescence regions 25. A specific portion remote from both the dislocation concentrated regions 11 and the high-luminescence regions 25 by a required distance corresponds to a proper portion suitable for forming the laser beam guide region. Accordingly, there will be no available portion for forming the laser beam guide region unless more than double the sum 70 µm comprising the minimum value 40 µm as the distance required for generating the above effect and the minimum value 30 µm as the distance "t" for generating the above effect can be secured as the pitch P. Due to this reason, range of the distance P is defined as P≧140 µm.

From the viewpoint whether the growth can be sustained while holding the positions of the projections and recesses constant or not in the formation of the GaN composite substrate 10, the value of the distance P is restricted. This is because, if the actual positions of the projections and recesses were displaced from the initial positions relative to the progress of the growth, the pitch P becomes inconstant, thereby making it difficult to set the laser beam guide region at a specific position against the produced GaN composite substrate 10. After studying the practical range of the pitch P by taking the above reasons into account, it was understood that the above condition could hardly be sustained when the pitch P was less than 50 µm, and thus, it was found that the pitch P should desirably be more than or equal to 100 µm.

Further, from the viewpoint of the function for causing the dislocation to be concentrated into the regions 11, it would be better to cause the facet {11-22} to be generated massively. When the pitch P is arranged to be more than or equal to 300 µm, as described above, defect density in the dislocation concentrated region 11 and the defect density in the low dislocation region favorably differ from each other by more than three orders of magnitude. Although there is no restriction on the upper limit of the distance P, if the distance P becomes excessive, projections and recesses of the produced ingot also become excessive, thus resulting in the decreased number of procurable wafers. Accordingly, approximately 1000 µm would be appropriate for the upper limit of the distance P. In conclusion, it is defined that 140 µm≦P is essential, preferably 300≦P is ideal. If it is required to define the upper limit, P ≦1000 is appropriate for use.

FOURTH EMBODIMENT OF THE PRESENT INVENTION

Figure 11:
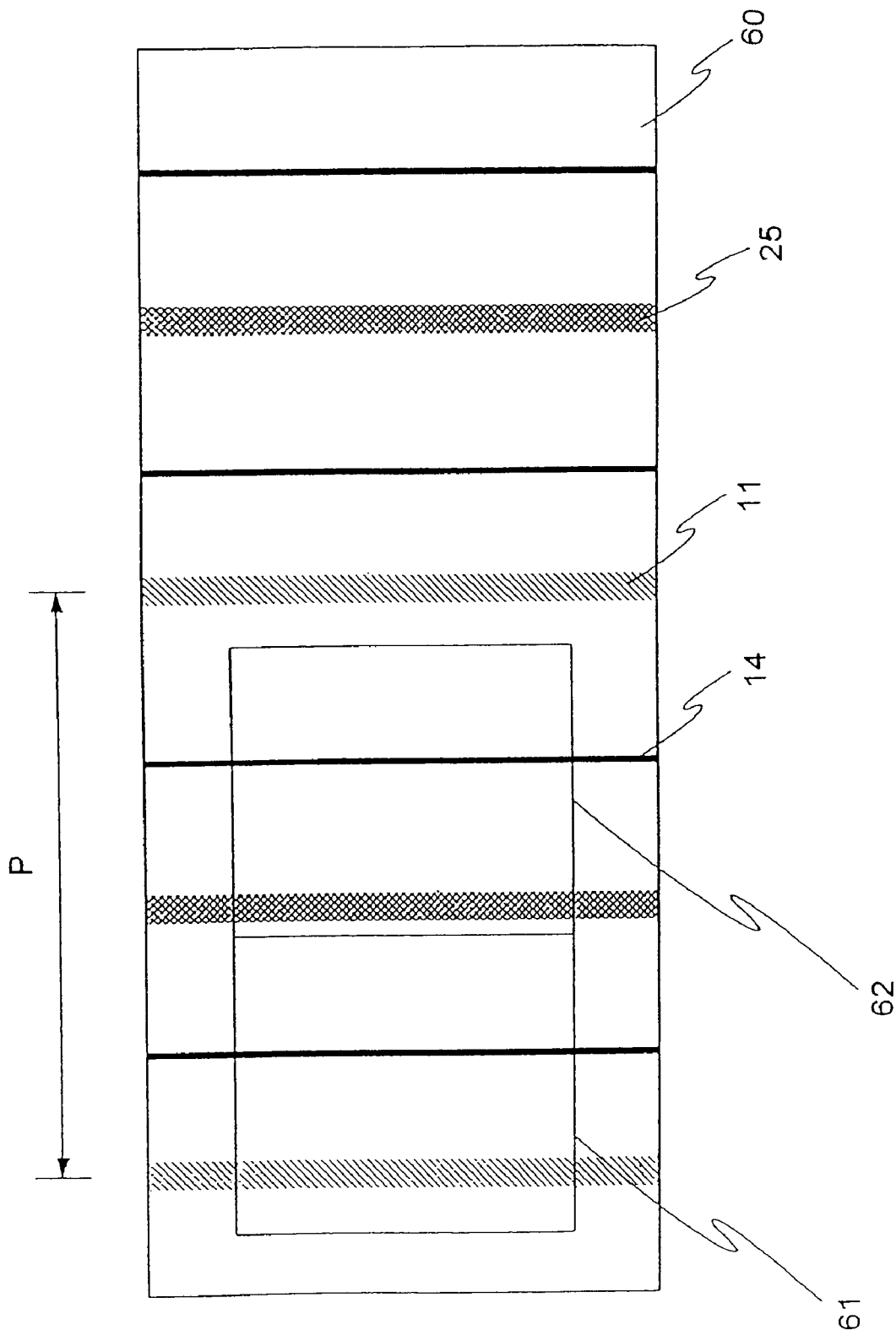
FIG. 11 is a plan view for schematically showing a method of manufacturing a semiconductor laser element according to a fourth embodiment of the present invention.

Although constitution of the semiconductor laser element related to the fourth embodiment is identical to that of the semiconductor laser element 3 of the third embodiment, values of the distance P, d, and t, differ from each other. FIG. 11 schematically illustrates disposition relationship between the laser beam guide region 14 formed in the semiconductor laser element, the dislocation concentrated region 11 and the high-luminescence region 25 present in the n-type GaN composite substrate 10. Local regions for constituting individual semiconductor laser elements (chips) in the n-type GaN composite substrate 60 are designated by the reference numerals 61 and 62. Note that, in the fourth, fifth, and the sixth embodiments, positional relationship between the laser beam guide region 14, the dislocation concentrated region 11, and the high-luminescence region 25, is different from that of the third embodiment. However, like the one shown in the third embodiment, the semiconductor laser element is designated by the reference numeral 3 in the fourth, fifth, and the sixth embodiments.

When executing the method of manufacturing the semiconductor laser element 3 according to the fourth embodiment, the pitch P between individual regions 11 concentrated with dislocation in the n-type GaN composite substrate 60 is defined as 500 μm. Two units of laser beam guide regions 14 are disposed per pitch, thereby forming two units of semiconductor laser elements (chips) 3 per pitch. Each of the two semiconductor laser elements 3 (shown as the regions 61 and 62) is provided with 250 μm of lateral width.

In the region 61, the distance "d" between the laser beam guide region 14 and the closest region 25 concentrated with dislocation is defined as 100 μm, whereas the distance "t" between the laser beam guide region 14 and the closest region 25 accommodating low-density dislocation is defined as 150 μm. In the other region 62, the distance "d" between the laser beam guide region 14 and the closest region 11 concentrated with dislocation is defined as 150 μm, whereas the distance "t" between the laser beam guide region 14 and the closest center portion 25 between the low-density dislocation accommodating regions is defined as 100 μm.

There is a specific relationship designated as 2W=P between the width W of the above-referred regions 61 and 62 and the pitch P of the region 11 concentrated with dislocation, where 2(t+d)=P. When expressing the distance "d" and "t" in the region 61 in terms of "d1" and "t1" and the distance "d" and "t" in the other region 62 in terms of "d2" and "t2", these are in the relationship expressed as "d1"="t2" and "d2"="t1".

In the region 61, only one unit of the dislocation concentrated region 11 is present inside of the n-type GaN composite substrate 60 without presence of the high-luminescence region 25. In the other region 62, only one unit of the high-luminescence region 25 is present in the n-type GaN composite substrate 60 without presence of the region 11 concentrated with dislocation. Also in the present fourth embodiment, range of the distance d, t, and P effective for the generation of the practical effect of the present invention conforms to the description on the preceding third embodiment. Those practical effects described in the third embodiment can be secured within the range of the distance d, t, and P even when implementing the fourth embodiment.

FIFTH EMBODIMENT OF THE PRESENT INVENTION

Figure 12:
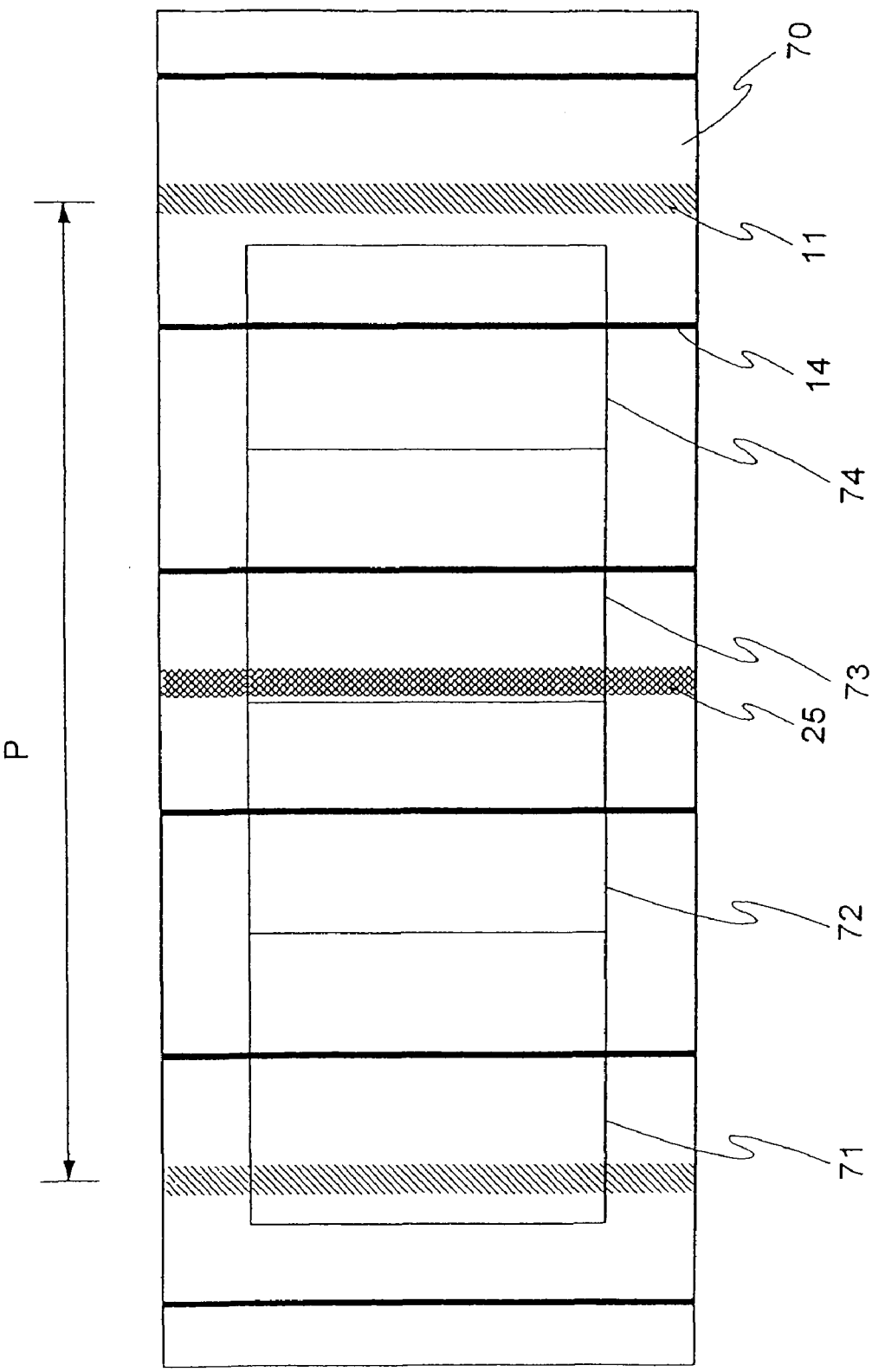
FIG. 12 is a plan view for schematically showing a method of manufacturing a semiconductor laser element according to a fifth embodiment of the present invention.

In the method of manufacturing the semiconductor laser element according to the fifth embodiment, the number of semiconductor laser element (chip) 1 to be produced per pitch P is increased to four. Like the one shown in FIG. 11, FIG. 12 schematically illustrates the disposition relationship between the laser beam guide region 14 formed in the semiconductor laser element, the dislocation concentrated region 11 present in the n-type GaN composite substrate, and the high-luminescence region 25 formed in this substrate. Those regions corresponding to individual semiconductor laser elements (chips) in the n-type GaN composite substrate 70 are respectively designated by the reference numerals 71 to 74.

In the method of manufacturing the semiconductor laser element 3 according to the fifth embodiment, the pitch P corresponding to the dislocation concentrated region 11 formed in the n-type GaN composite substrate 70 is defined as 800 μm, in which four of the laser beam guide regions 14 are disposed per pitch so as to form four of the semiconductor laser beam guide regions (chips) per pitch. Each of the semiconductor laser elements 3 (corresponding to the regions 71 to 74 shown in FIG. 12) has an even lateral width W, which is defined as 200 μm. In each of the serially aligned regions 71, 72, 73, and 74, the distance "d" between the laser beam guide region 14 and the closest region 11 concentrated with dislocation is defined as 80 μm, 280 μm, 320 μm, and 120 μm, respectively. The distance "t" between the laser beam guide region 14 and the closest center portion 25 of the low density dislocation accommodating region in respective regions 71 to 74 is defined as 320 μm, 120 μm, 80 μm, and 280 μm, respectively.

As shown in FIG. 12, the region 71 includes a unit of the region 11 concentrated with dislocation, the region 73 includes a unit of high-luminescence region 25, whereas neither of the regions 72 and 74 include the region 11 concentrated with dislocation or the high-luminescence region 25. According to the method of manufacturing the semiconductor laser element 3 based on the fifth embodiment, there is a relationship expressed as 4W=P, and further, there is a relationship expressed as 2 (t+d)=P against each of the laser beam guide regions 14. Those practical effects described in the third embodiment can also be secured within the range of the distance d, t, and P, even when implementing the fifth embodiment.

SIXTH EMBODIMENT OF THE PRESENT INVENTION

Figure 13:
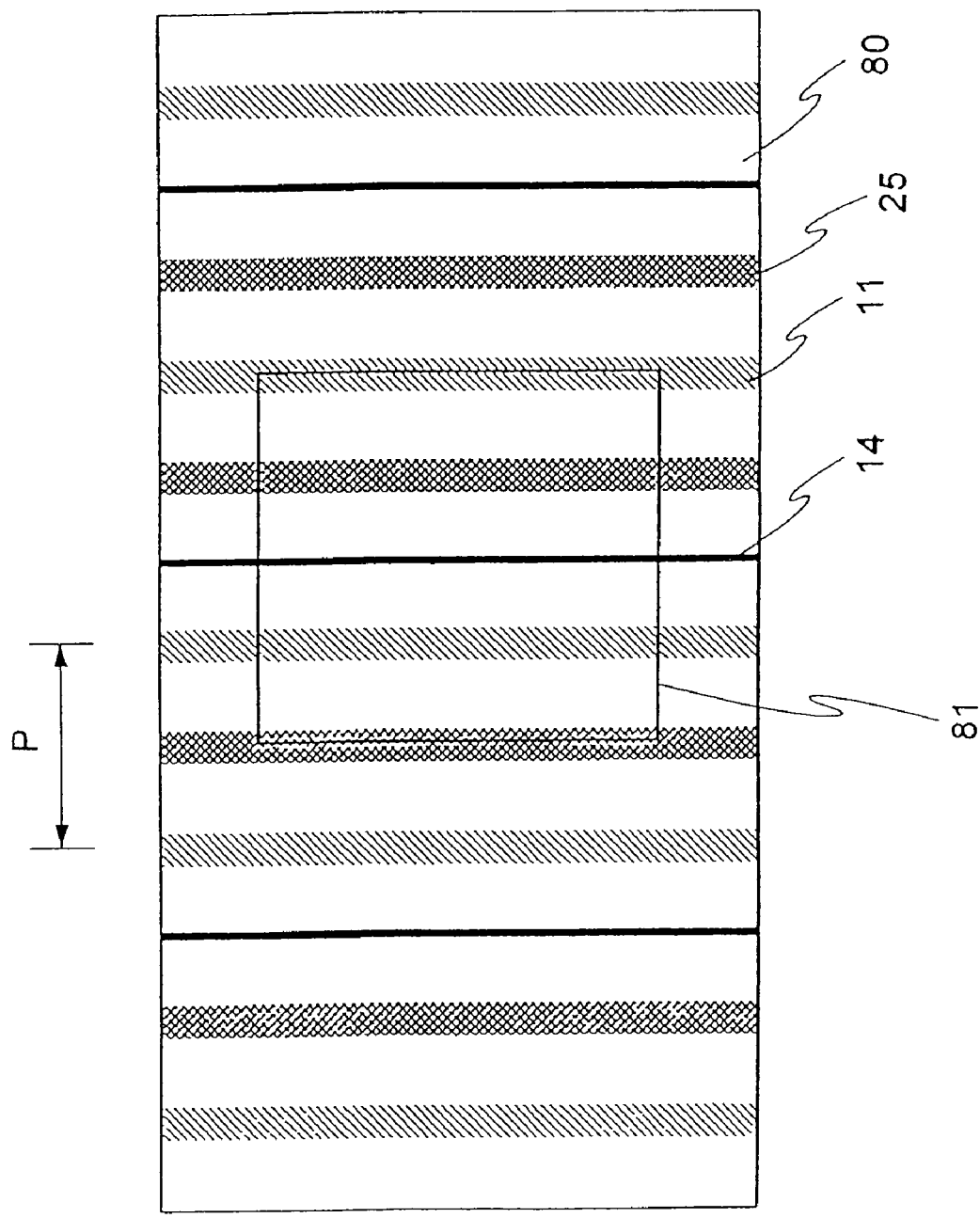
FIG. 13 is a plan view for schematically showing a method of manufacturing a semiconductor laser element according to a sixth embodiment of the present invention.

In contrast with the fourth or fifth embodiment, the sixth embodiment introduces the relationship expressed as width W>pitch P. Like the one shown in FIG. 11, FIG. 13 schematically illustrates the disposition relationship between the laser beam guide region 14 formed in the semiconductor laser element, the region 11 concentrated with dislocation present in the n-type GaN composite substrate, and the high-luminescence region 25. The region to be constituted into the semiconductor laser element (chip) 3 within the n-type GaN composite substrate 80 is designated by a reference numeral 81.

According to the method of manufacturing the semiconductor laser element based on the sixth embodiment, the pitch P of the region 11 concentrated with dislocation present in the n-type GaN composite substrate 80 is defined as 200 μm. The lateral width W of the semiconductor laser element 3 (corresponding to the region 81 shown in FIG. 13) is defined as 300 μm. Concretely, it is arranged to form two third (⅔) unit of semiconductor laser element (chip) 3 per pitch (in other words, forms one chip 3 per 1.5 pitch). The distance "d" between the laser beam guide region 14 and the closest region 11 concentrated with dislocation is defined as 50 μm, whereas the distance "t" between the laser beam guide region 14 and the closest center portion 25 of the low-density dislocation accommodating region is defined as 50 μm.

As shown in FIG. 13, at least one unit or more than one unit of the dislocation concentrated region 11 and the high-luminescence region 25 is contained in a unit of semiconductor laser element (chip). In the method of manufacturing the above semiconductor laser element according to the sixth embodiment, (⅔)W=P, and further, 2 (t+d)=P against each of the laser beam guide regions 14.

Those practical effect described for implementing the third embodiment can also be secured within the distance range d, t, and P, even when implementing the sixth embodiment.

In the above third to sixth embodiments, the description has serially referred to the arrangement for forming one unit, two unit, four unit, and two third (⅔) unit of semiconductor laser element per pitch. However, applicable range of the present invention is not solely limited to the above range, but it is also possible to dispose 6 units, one half (½) unit, and one third (⅓) unit as well. Further, by way of arranging that part of the semiconductor laser elements to be disposed on the GaN composite substrate 10 may exceed a predetermined range of the distance "t" and "d", it is also possible to provide the above laser elements by a certain number other than the value that can be expressed in terms of multiple integral number or simple fraction number.

SEVENTH EMBODIMENT OF THE PRESENT INVENTION

Figure 14:
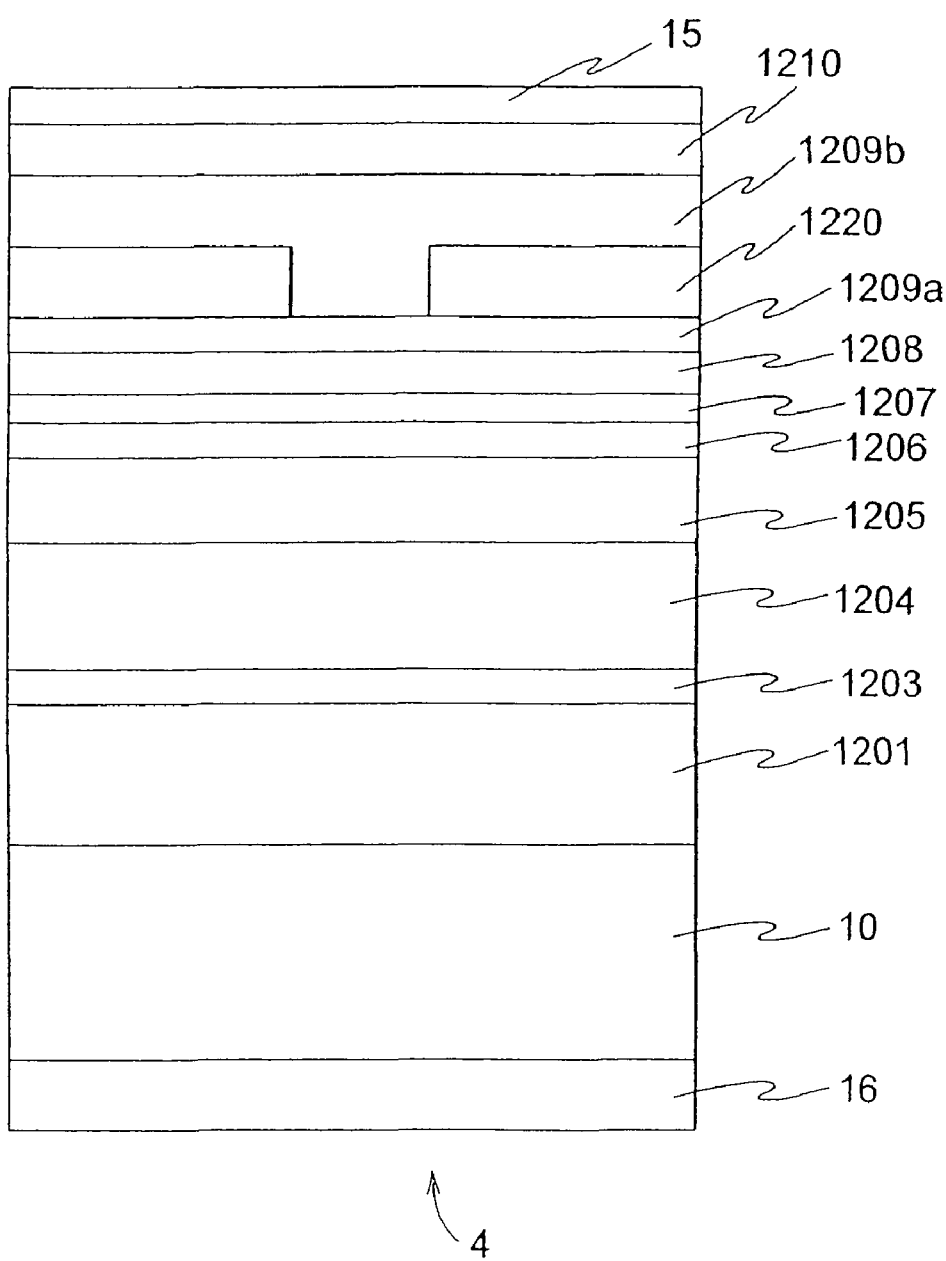
FIG. 14 is a vertical cross-sectional view for schematically showing further stratum constitutions of a semiconductor laser element according to the third to sixth embodiments of the present invention.

The seventh embodiment replaces the nitride semiconductor laser element 3 incorporating the ridge-stripe form configuration described in the preceding third to sixth embodiments with a nitride composite semiconductor laser element 4 incorporating a current inhibiting layer. Referring now to FIG. 14, a constitution of the nitride composite semiconductor laser element 4 incorporating a current inhibiting layer is described below.

Concretely, the semiconductor laser element 4 according to the seventh embodiment of the present invention comprises the following: an n-type GaN composite substrate 10, and those serially laminated layers disposed on the substrate 10 including; an n-type GaN layer 1201, an n-type $In_{0.07}Ga_{0.93}N$ crack preventive layer 1203, an n-type $Al_{0.1}Ga_{0.9}N$ clad layer 1204, an n-type GaN beam guide layer 1205, an active layer 1206, a p-type $Al_{0.2}Ga_{0.8}N$ carrier block layer 1207, a p-type GaN beam guide layer 1208, a p-type $Al_{0.1}Ga_{0.9}N$ first clad layer 1209a, a current inhibiting layer 1220, a p-type $Al_{1.0}Ga_{0.9}N$ second clad layer 1209b, a p-type InGaN contact layer 1210, a positive electrode 15, and a negative electrode 16.

The current inhibiting layer 1220 may consist of a layer capable of inhibiting current so as to enable current flowed from the positive electrode 15 to solely permeate through width-wise interval of the current inhibiting layer 1220. For example, the current inhibiting layer 1220 may be composed of an n-type $Al_{0.25}Ga_{0.75}N$ layer. The Al composite ratio of the current inhibiting layer 1220 is not always limited to be 0.25, but any other value may be applied. In the present embodiment, an opening of the current inhibiting layer 1220 behaves in correspondence with the laser beam guide region 14. Practical effects of the seventh embodiment described in the third embodiment can also be secured within the range of the distance d, t, and P, even when implementing the present embodiment.

EIGHTH EMBODIMENT OF THE PRESENT INVENTION

The eighth embodiment arranges that at least any of the elements including arsenic (As), phosphor (P), and antimony (Sb), is included in the active layer of the above nitride composite semiconductor laser element 3 or 4. Except for this arrangement, constitution of the nitride composite semiconductor laser element 3 or 4 remains as was already described in the preceding embodiments.

In the eighth embodiment, it is so arranged that at least any of the three elements including As, P, and Sb, is included at least in the well layer among the active layer 1106 and 1206 that constitute the nitride composite semiconductor laser element 3 or 4. Assuming that the composite ratio of the sum of the above elements is X, whereas the composite ratio of nitrogen element included in the well layer is Y, the value of X is less than that of Y. Further, X/(X+Y) corresponds to a value less than or equal to 0.3 (30%), preferably less than or equal to 0.2 (20%). Further, the lower limit value of the sum of the above three elements is greater than $1\times10^{18}$ cm$^{-3}$.

When the composite ratio rose higher than 20%, concentration separation, i.e., a phenomenon in which the composition of the above-mentioned elements varies from one region to another within the quantum well layer, starts to occur. When the composite ratio X rose further than 30%, it causes the depth separation to shift itself to crystalline separation intermingled with hexagonal crystals and cubic crystals, thereby causing the crystalline characteristics of the well layer to be lowered. On the other hand, when the added sum of the above elements becomes less than $1\times10^{18}$ cm$^{-3}$, practical effect of adding the above elements to the well layer can no longer be secured.

Practical effect of the eighth embodiment is attributable to a small effective mass of electrons and holes of the well layer and a substantial mobility of electrons and holes of the well layer. In the case of the semiconductor laser element, the former advantage means that distribution of carrier inversion required for generating laser oscillation by feeding a small amount of current. The latter advantage means that, even if electrons and holes are extinguished in the active layer by effect of the reunion of luminescence, due to diffusion, electrons and holes can be infused anew at an extremely fast rate. In other words, compared to such a conventional nitride semiconductor laser element totally devoid of any of the above elements including As, P, and Sb, in the conventional active layer thus far being reported, the nitride semiconductor laser element according to the eighth embodiment of the present invention features low density of current at threshold value and excellent characteristics in the noise suppression. Practical effect of the present invention as described in the third embodiment can also be secured within the range of the distance d, t, and P, even when implementing the eighth embodiment.

NINTH EMBODIMENT OF THE PRESENT INVENTION

When forming individual nitride semiconductor laser elements on a substrate, the ninth embodiment applies a selective growth technique. Except for this application, all the aspects are identical to any of the preceding third to eighth embodiments.

The selective growth technique consists of those serial processes described below. An opening provided mask composed of growth inhibiting material including oxide such as silicon dioxide and nitride such as SiN or AlN is previously formed on a substrate. When forming individual nitride semiconductor layers on the substrate, the selective growth technique controls growth processes in order that the growth can be promoted in the lateral direction at the initial stage of the growth. By applying this technique, it is possible to effectively prevent crack from potentially being generated relative to the growth of individual nitride semiconductor layers. The mask can be formed in correspondence with the surfaces right above the dislocation concentrated region 11 and the high-luminescence region 25, or the mask may also be formed independently of the location cited above. However, in order to effectively prevent crack from potentially being generated in the laser beam guide region, it is preferred to form the mask right beneath the laser beam guide region 14.

TENTH EMBODIMENT OF THE PRESENT INVENTION

Figure 15:
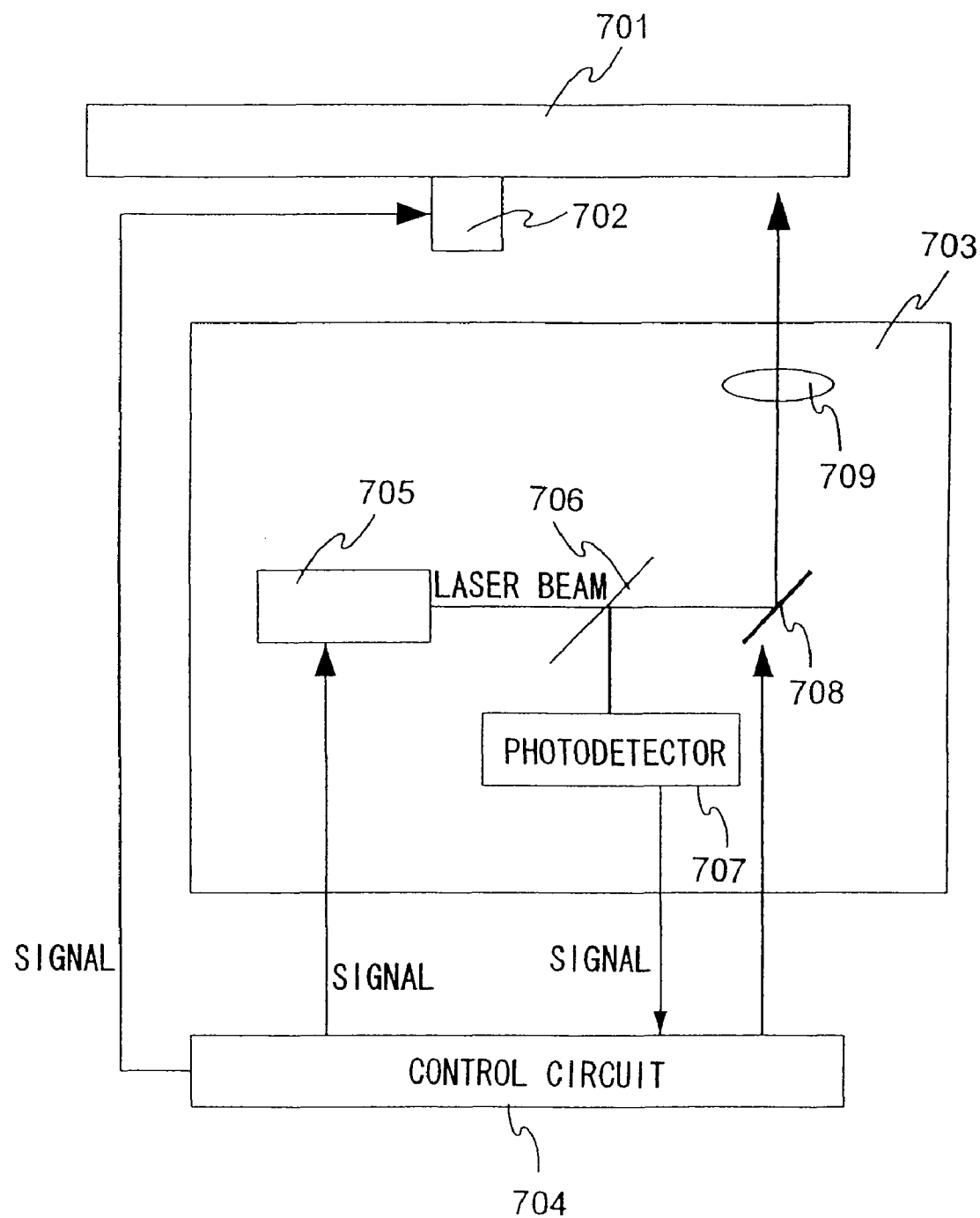
FIG. 15 is a simplified block diagram of the internal constitution of a semiconductor optical device according to the tenth embodiment of the present invention which incorporates the nitride composite semiconductor laser element.

Referring now to FIG. 15, the tenth embodiment complete with practical application of the above-described nitride semiconductor laser element to a semiconductor optical device such as an optical pickup system is described below. FIG. 15 is a simplified schematic block diagram for explanatory of the inner constitution of a semiconductor optical device according to the tenth embodiment of the present invention. The following description refers to an example of applying the above-described nitride semiconductor laser element to an optical disc drive unit.

The optical disc drive unit shown in FIG. 15 consists of the following: a spindle motor 702 for rotating an optical disc 701 in the circumferential direction; an optical pickup unit 703 for reading information by causing the optical disc 701 to be irradiated by laser beam; and a controlling circuit 704 for controlling operations of the whole components of the optical disc drive unit. It should be noted that the optical pickup unit 703 shifts itself in the diametrical direction of the optical disc 701 via function of an actuator (not shown) driven by the controlling circuit 704.

In the above optical disc drive unit shown in FIG. 15, the optical pickup unit 703 consists of the following: a laser unit 705 incorporating a nitride semiconductor laser element for emitting laser beam; a beam splitter 706 which enables laser beam emitted from the laser unit 705 to permeate through the beam splitter itself and guides laser beam from a follow-up mirror 708 to a beam detector 707; a beam detector 707 which detects laser beam from the beam splitter 706 and then transmits the beam-detect signal to a controlling circuit 704; a follow-up mirror 708 which guides laser beam from the laser unit 705 to an optical disc 701 and then guides laser beam reflected from the optical disc 701 to the beam splitter 706; and an object lens 709 which causes laser beam reflected from the follow-up mirror 708 to be condensed on the optical disc 701.

As described above, the inventive nitride composite semiconductor laser element installed in the laser unit 705 is capable of generating 330 to 550 nm of oscillating wavelength and stably operating itself at 30 mW of high output condition at 60° C. of high temperature in the environmental atmosphere, and yet, further features its durable laser oscillating service life. Accordingly, since the shorter the oscillating wave-length, the higher the recording and reproducing density to be realized, the inventive nitride composite semiconductor laser element is most suitable for application to an optical disc drive unit designed for the recording and reproduction of high-density optical data with high reliability.

In the course of recording information by operating the optical disc drive unit featuring the above constitution, laser beam output from the laser unit 705 is modulated in correspondence with input data from the controlling circuit 704, and then, the modulated laser beam passes through the beam splitter 706 and then reflected by the follow-up mirror 708 before eventually being irradiated onto the optical disc 701 via the object lens 709, thus enabling information to be recorded on the optical disc 701. Alternatively, magnetic field transferred onto the recording surface of the optical disc 701 is modulated in response to the information received from the controlling circuit 704 before eventually causing the modulated information to be recorded on the optical disc 701.

In the course of reproducing information, laser beam is subject to optical variation by the pit array on the optical disc 701, and then passes through the object lens 709. The laser beam is then reflected by the follow-up mirror 708, and then reflected by the beam splitter 706 before eventually being detected by the beam detector 707 so as to generate a reproduction signal. These serial processes are regulated by the controlling circuit 704. The above semiconductor laser element outputs laser beam containing 30 mW of the recording power and approximately 5 mW of the reproducing power for example.

Further to the above-referred optical disc drive unit incorporating the above optical pickup system, the nitride composite semiconductor laser element according to the present invention is also applicable to a laser printer, bar-code reader, a projector using laser beam comprising three primary colors including blue, green, and red, or the like.

INDUSTRIAL APPLICABILITY

The present invention is suitable for constituting a laser beam generating source featuring high-output capacity and durable service life and also for constituting the method for forming the laser beam generating source. In addition, the prevent invention is effectively applicable to constitute lighting source of a variety of optical devices such as an optical disc drive unit, laser printer, or a bar-code reader, or the like, as well.

The invention claimed is:

1. A method of fabricating a nitride semiconductor laser device, comprising:

providing a nitride semiconductor substrate formed solely of a nitride semiconductor and comprising a plurality of dislocation-concentrated regions in a shape of stripes substantially parallel to one another and a plurality of low-dislocation regions; and forming on the nitride semiconductor substrate a nitride semiconductor layer comprising a nitride semiconductor laser structure comprising a stripe-shaped laser light guide region, the laser light guide region being formed above a low-dislocation region substantially parallel thereto, and a distance d of 40 µm or more being provided in a horizontal direction between the laser light guide region and a dislocation-concentrated region closest thereto.

2. The method of fabricating a nitride semiconductor laser device according to claim 1, wherein a middle region of each low-dislocation region is located along a middle line between adjacent dislocation-concentrated regions, and a distance t in a horizontal direction between the laser light guide region and a middle region, closest thereto, of a low-dislocation region is 30 μm or more.

3. The method of fabricating a nitride semiconductor laser device according to claim 2, wherein the distance t is 50 μm or more.

4. The method of fabricating a nitride semiconductor laser device according to claim 1, wherein the nitride semiconductor substrate has, in a low-dislocation region, a stripe-shaped high-luminescence region substantially parallel to the dislocation-concentrated regions, and wherein a distance t in the horizontal direction between the laser light guide region and a high-luminescence region closest thereto is 30 μm or more.

5. The method of fabricating a nitride semiconductor laser device according to claim 1, wherein the distance d is 60 μm or more.

6. The method of fabricating a nitride semiconductor laser device according to claim 1, wherein, in the nitride semiconductor substrate, a distance P between adjacent dislocation-concentrated regions is 140 μm or more.

7. The method of fabricating a nitride semiconductor laser device according to claim 6, wherein, in the nitride semiconductor substrate, the distance P is 300 μm or more.

8. The method of fabricating a nitride semiconductor laser device according to claim 1, further comprising forming a growth-inhibiting film for inhibiting growth of a nitride semiconductor crystal on a surface of the nitride semiconductor substrate in a position where the growth-inhibiting film covers the dislocation-concentrated region, the nitride semiconductor layer being formed on top of the nitride semiconductor substrate in the position where the growth-inhibiting film is formed.

9. The method of fabricating a nitride semiconductor laser device according to claim 8, wherein, for each dislocation-concentrated region, there are formed a plurality of the growth-inhibiting film in a shape of slats so that each dislocation-concentrated region is covered by a plurality of growth-inhibiting films.

10. The method of fabricating a nitride semiconductor laser device according to claim 9, wherein the plurality of growth-inhibiting films formed for each dislocation-concentrated region have a width in a range from 1 μm to 10 μm each and are arranged substantially parallel to one another and at a distance in a range from 1 μm to 10 μm from one another, each dislocation-concentrated region being covered by a region corresponding to all the widths of and distances between the plurality of growth inhibiting films.

11. A method of fabricating a nitride semiconductor laser device including a nitride semiconductor substrate and a nitride semiconductor layer formed thereon, wherein
the nitride semiconductor substrate is so formed as to include
dislocation-concentrated regions containing solely a nitride semiconductor and stripe-shaped and
a low-dislocation region elsewhere than in the dislocation-concentrated regions,
the nitride semiconductor layer is so formed as to include a stripe-shaped laser light guide region,
the laser light guide region is formed above the low-dislocation region substantially parallel to the dislocation-concentrated regions,
a distance d in a horizontal direction between the laser light guide region and a dislocation-concentrated region closest thereto is 40 μm or more, and
in the low-dislocation region, a high-luminescence region is formed between adjacent dislocation-concentrated regions.

12. The method of fabricating a nitride semiconductor laser device according to claim 11, wherein a middle region of each low-dislocation region is located along a middle line between adjacent dislocation-concentrated regions, and a distance t in a horizontal direction between the laser light guide region and a middle region, closest thereto, of a low-dislocation region is 30 μm or more.

13. The method of fabricating a nitride semiconductor laser device according to claim 12, wherein the distance t is 50 μm or more.

14. The method of fabricating a nitride semiconductor laser device according to claim 11, wherein the nitride semiconductor substrate has, in a low-dislocation region, a stripe-shaped high-luminescence region substantially parallel to the dislocation-concentrated regions, and wherein a distance t in the horizontal direction between the laser light guide region and a high-luminescence region closest thereto is 30 μm or more.

15. The method of fabricating a nitride semiconductor laser device according to claim 11, wherein the distance d is 60 μm or more.

16. The method of fabricating a nitride semiconductor laser device according to claim 11, wherein, in the nitride semiconductor substrate, a distance P between adjacent dislocation-concentrated regions is 140 μm or more.

17. The method of fabricating a nitride semiconductor laser device according to claim 16, wherein, in the nitride semiconductor substrate, the distance P is 300 μm or more.

* * * * *